United States Patent
Snelgrove

(10) Patent No.: US 8,836,550 B2
(45) Date of Patent: Sep. 16, 2014

(54) SYSTEM AND METHOD FOR DIGITALLY CORRECTING MISMATCHES IN MULTIPATH ADCS

(75) Inventor: William Martin Snelgrove, Toronto (CA)

(73) Assignee: Kapik Inc., Toronto (CA)

(*) Notice: Subject to any disclaimer, the term of this patent is extended or adjusted under 35 U.S.C. 154(b) by 0 days.

(21) Appl. No.: 13/575,063

(22) PCT Filed: Feb. 1, 2011

(86) PCT No.: PCT/CA2011/000125
§ 371 (c)(1),
(2), (4) Date: Jul. 25, 2012

(87) PCT Pub. No.: WO2011/091527
PCT Pub. Date: Aug. 4, 2011

(65) Prior Publication Data
US 2012/0293348 A1 Nov. 22, 2012

Related U.S. Application Data

(60) Provisional application No. 61/300,098, filed on Feb. 1, 2010.

(51) Int. Cl.
*H03M 1/10* (2006.01)
*H03M 1/12* (2006.01)

(52) U.S. Cl.
CPC .......... *H03M 1/1033* (2013.01); *H03M 1/1215* (2013.01)
USPC .......................................... 341/118; 341/120

(58) Field of Classification Search
USPC .................................. 341/118, 120
See application file for complete search history.

(56) References Cited

U.S. PATENT DOCUMENTS

| | | | |
|---|---|---|---|
| 6,522,282 B1 | 2/2003 | Elbornsson | |
| 6,804,359 B1 | 10/2004 | Yu et al. | |
| 7,978,104 B2* | 7/2011 | Johansson | 341/120 |
| 2002/0175843 A1 | 11/2002 | Sonkusale et al. | |
| 2007/0069937 A1* | 3/2007 | Balakrishnan et al. | 341/161 |
| 2007/0263673 A1* | 11/2007 | Agazzi et al. | 370/516 |
| 2008/0024338 A1 | 1/2008 | Huang | |
| 2009/0273495 A1 | 11/2009 | Asami | |
| 2011/0193732 A1* | 8/2011 | Sestok et al. | 341/118 |
| 2011/0260898 A1* | 10/2011 | Velazquez | 341/110 |

OTHER PUBLICATIONS

Elbornsson et al., Blind Adaptive Equalization of Mismatch Errors in a Time-Interleaved A/D Converter System, IEEE Transactions on Circuits and Systems-I: Regular Papers, vol. 51, No. 1, Jan. 2004 pp. 151-158.*

(Continued)

*Primary Examiner* — Howard Williams
(74) *Attorney, Agent, or Firm* — Perry + Currier Inc.

(57) ABSTRACT

A system and method of reducing the effects of nonidealities of ADCs in multipath converters is disclosed. The system and method employs a variety of measure and correction blocks to determine statistical properties of the output stream of the multipath converter and to apply corrections to the operation of the subconverters of the multipath converter based upon differences in the measured statistics and expected target values, either explicit or implicit, for those statistics. A variety of examples of possible measure and configuration blocks are disclosed, as is the cascading of the measure and correction blocks to correct multiple errors in the output of the multipath converter. Feedforward (purely digital) and feedback (analog and digital) solutions are both disclosed.

17 Claims, 22 Drawing Sheets

(56) References Cited

OTHER PUBLICATIONS

Tsung-Heng Tsai et al. Correction of Mismatches in a Time-Interleaved Analog-to-Digital Converter in an Adaptively Equalized Digital Communication Receiver, IEEE Transactions on Circuits and Systems-I: Regular Papers, vol. 56, No. 2, Feb. 2009.*

Kurasowa et al., Channel Linearity Mismatch Effects in Time-Interleaved ADC Systems, The 2001 IEEE International Symposium on Circuits and Systems, 2001. ISCAS 2001, May 2001, pp. 420-423.*

Kurasowa et al., Explicit Analysis of Channel Mismatch Effects inTime-Interleaved ADC Systems, IEEE Transactions on Circuits and Systems-I: Fundamental Theory and Applications, vol. 48, No. 3, Mar. 2001.*

Tsai et al., Bandwidth Mismatch and Its Correction in Time-Interleaved Analog-to-Digital Converters, IEEE Transactions on Circuits and Systems-II: Express Briefs, vol. 53, No. 10, Oct. 2006.*

Satarzadeh et al., Adaptive Semiblind Calibration of Bandwidth Mismatch for Two-Channel Time-Interleaved ADCs, IEEE Transactions on Circuits and Systems-I: Regular Papers, vol. 56, No. 9, Sep. 2009.*

Gu et al. Frequency-Domain Analysis of A/D Converter Nonlinearity; IEEE 1994 International Symposium on Circuits and Systems, London, England.

Corresponding European Patent Application No. 11736575.9 Search Report dated Sep. 19, 2013.

* cited by examiner

US 8,836,550 B2

SYSTEM AND METHOD FOR DIGITALLY CORRECTING MISMATCHES IN MULTIPATH ADCS

FIELD OF THE INVENTION

The present invention relates to a system and method for correcting mismatch errors in multipath analog to digital converters (ADCs) while they are in operation. More specifically, the present invention relates to a system and method for estimating and correcting errors in the output digital stream of an analog to digital converter constructed by combining the outputs of at least two slower analog to digital converters, sampled on consecutive phases, where the statistical properties of the output stream are corrected to be stationary or to have a predetermined cyclostationary structure.

BACKGROUND OF THE INVENTION

It is desirable to convert analog electronic signals to digital form with an analog to digital converter, and a great many electronic circuits are known for this purpose. These analog to digital converters are known to have limitations on the speed at which they can operate in a given integrated circuit technology (i.e.—the feature size, process and material used to fabricate the integrated circuit) and therefore on the bandwidth of the analog signals that they can be used to convert. As these limits are approached, the converters are also known to consume more energy per sample, to have poorer manufacturing yield, and to have degraded accuracy.

In order to overcome this speed limitation, it is known to combine two or more analog to digital converters each acting as "subconverters" of a faster converter system. In the most common approach, the subconverters sample the input signal in a "round robin" fashion. As a special and well-known case, two subconverters may alternate taking samples so that the overall system has an effective sampling rate twice as high as that of the individual subconverters. One way of implementing this is to drive the sampling on each subconverter with a different clock, the two clocks being 180 degrees apart in phase. In the general case of N subconverters, each of the subconverters sample at phases 360/N degrees apart and the effective sampling rate is N times higher than the sampling rate of a single subconverter. These converter systems are often referred to as "multipath converters" or "N-path converters".

It is also known to apply the multipath technique repeatedly, so that a subconverter is implemented as a system of yet slower sub-sub-converters.

Analog to digital converters are known to suffer from practical nonidealities, such as offset voltages, gain errors, bandwidth limitations, and various types of nonlinearities. In multipath converters these nonidealities also differ from one subconverter to another, and these "mismatches" create additional types of nonideality which cause additional difficulties. For example, some radio receiver systems are quite tolerant of a small gain error in analog to digital conversion, but much less tolerant of the gain varying from sample to sample. Further, the circuitry used to define sampling times is also subject to nonidealities, so that practical sampling phases may not be exactly 360/N degrees apart and this also causes difficulties in interpreting the data in many circumstances.

Prior art techniques for reducing the effects of nonidealities of ADCs include performing calibration of the analog to digital converters, including multipath analog to digital converters, by applying known signals, observing the resulting outputs, and making appropriate adjustments to the operation of the circuits or to the interpretation of their outputs. This prior art approach is often referred to as "off-line" calibration, because the requirement to apply a known signal interferes with the intended operation of the analog to digital converter in measuring unknown signals. Off-line calibration can be done as part of manufacture, or at the time of powering-up a system but in the practical case, where many errors "drift" with time, the quality of calibration will degrade over time.

Therefor, it is desirable, to perform "on-line" calibration, if possible, which is capable of tracking drifts in the errors of the ADCs. Algorithms suitable for on-line calibration can also generally be applied to known signals, and hence used for initial training if desired. A known two-path on-line calibration method was previously developed by the present inventor and others and is shown in U.S. Pat. No. 6,804,359 to Yu et al. The system taught in Yu can deal with offset and sample-phase timing errors of a two path ADC but, while the system taught in Yu can be useful, it does suffer from disadvantages in that it cannot deal with more than two ADC's and cannot address errors such as gain and bandwidth mismatch.

It is desired to provide correction circuitry operable to correct for mismatches and errors between N subconverters in multipath analog to digital converters.

SUMMARY OF THE INVENTION

It is an object of the present invention to provide a system and method of reducing the effects of nonidealities of ADCs in multipath converters which obviates, or mitigates, at least one disadvantage of the prior art.

According to a first aspect of the present invention, there is provided a system for statistical correction of mismatches between subconverters of a multipath converter, comprising: at least one signal-stream correction sub-system responsive to a signal stream and a correction stream; at least one statistical measure sub-system operable to produce a statistical measure stream estimating a desired statistical property of said corrected signal stream; and at least one measure integration subsystem responsive to said statistical measure stream and operable to produce said correction stream.

According to a second aspect of the present invention, there is provided a system for statistical correction of mismatches between subconverters in a multipath converter, comprising: at least one statistical measure sub-system operable to produce a statistical measure stream estimating a desired statistical property of the signal stream output by the multipath converter; at least one measure filtering subsystem responsive to said statistical measure stream and operable to produce a correction stream; and at least one signal-stream correction sub-system responsive to the signal stream and the correction stream. Preferably, both feedback or feedforward embodiments of the present invention further comprise a reference-statistic estimation subsystem operable to provide an estimate of the desired values of the statistical measure.

According to a another aspect of the present invention, there is provided a feedback method for correction of mismatch errors between subconverters of a multipath converter, comprising the steps of: correcting a signal stream according to a correction stream; and estimating a statistic of said corrected signal stream to produce said correction stream where the estimation of the statistic of said corrected signal stream further comprises the step of estimating a single sample of a statistic and integrating said single samples of statistics separately for data corresponding to each subconverter.

In yet another aspect of the present invention, there is provided a method for mitigation of the effects of mismatch errors in the output signal stream of a multipath converter having mismatch errors among subconverters, comprising the steps of: estimating a statistic of a converter signal stream to produce a correction stream by estimating a single sample of a statistic and lowpass filtering said single samples of statistics separately for data corresponding to each subconverter; and correcting said signal stream according to said correction stream.

Preferably, either the method further comprises a reference-statistic estimation operable to provide an estimate of the desired values of the statistical measure.

It is preferable that the correction circuitry for the multipath converters be amenable to implementation either in a purely digital form or in a mixed analog/digital form. It is also preferable that the correction circuitry be suitable for use at speeds that are relatively high for a given integrated circuit technology. It is also preferable that the correction circuitry be easily adapted for many different types of mismatch, since different types of subconverter circuits suffer different types of mismatch. It is also preferable that the correction circuitry be adaptable to signal statistics that vary from application to application and over time within a given application.

According to another aspect of the present invention, there is provided a multipath analog to digital converter comprising: at least two subconverters each operable to sample respective samples of an analog signal applied to the multipath analog to digital converter and to output a digital value representing the sample of the analog signal; and at least one measure and correction block operable to determine the value of a preselected statistical characteristic of the digital values output by the at least two subconverters and to output a correction signal representing the difference between the determined value and a target value, the correction signal altering the operation of the multipath analog to digital converter to reduce the errors in the output of the multipath analog to digital converter.

The present invention provides a system and method for mitigation of the effects of mismatches between subconverters in a multipath analog to digital converter. Several suitable configurations for the present invention are discussed, including those operable to correct offset mismatch, gain mismatch, sample-timing mismatch, differential non-linearity (DNL) and DNL mismatch, and bandwidth mismatch. The configurations discussed are suitable for combination in cascade, or other topologies, so that several types of errors may be corrected. The configurations discussed are also suitable for purely digital or mixed analog/digital implementation. The configurations described are also suitable for efficient implementation, including the use of subsampling. The configurations discussed are also suitable for diagnosing errors, drifts, failures and input statistics in multipath analog to digital converters.

BRIEF DESCRIPTION OF THE DRAWINGS

Preferred embodiments of the present invention will now be described, by way of example only, with reference to the attached Figures, wherein:

FIG. 19 shows the convergence of correction coefficients for correcting the timing of the set of samples of FIG. 18a;

DETAILED DESCRIPTION OF THE INVENTION

The present invention provides a method and system for correcting the effects of mismatches among subconverters and timing errors in multipath analog-to-digital converters. The technique is applicable both to corrections applied on a purely digital basis in the form of feed forward corrections to the output signals and to analog corrections fed back to modify the behavior of the subconverters. As well as correcting errors, it can be used to diagnose them.

For a large class of signals it is reasonable to assume that the input statistics should be stationary, i.e.—that statistical properties should not depend on the time index and should not depend on which subconverter is used. For example, if signals carrying digital data are sampled at a rate incommensurate with the data rate, or if analog video signals are sampled, it would be reasonable to expect the average outputs of each subconverter to be the same. If, therefore, the statistical behavior in a multipath converter measuring such a signal does depend on which subconverter is measuring the signal, this dependence can be used as a measure of mismatch and a corresponding operation may be used to correct the error. Preferably the hardware to do this estimation and correction will be relatively simple, so that it can run at high speeds and at relatively low power consumption levels. For another large class of signals it is expected that the input statistics will vary with time index in such a way as to cause the statistical properties of the inputs to some data converters to differ from those of others, but will differ in a known manner. For example, in the common case that a data signal is sampled twice for each symbol, with a phase-locked loop synchronizing data conversion to the input signal, the even-index signal samples might be expected to correspond to data bits and the odd-index samples to correspond to data transitions. In this case the averages might be expected to be identical but the mean-square of the signals could be different. For example, in the special case of binary signaling with random data and a good channel, the mean-squares of the different indexed samples would be expected to differ by a factor of two. As for the stationary case, it should in principle be possible to design hardware to estimate and correct statistics to those of the known input signal.

Figure 1:
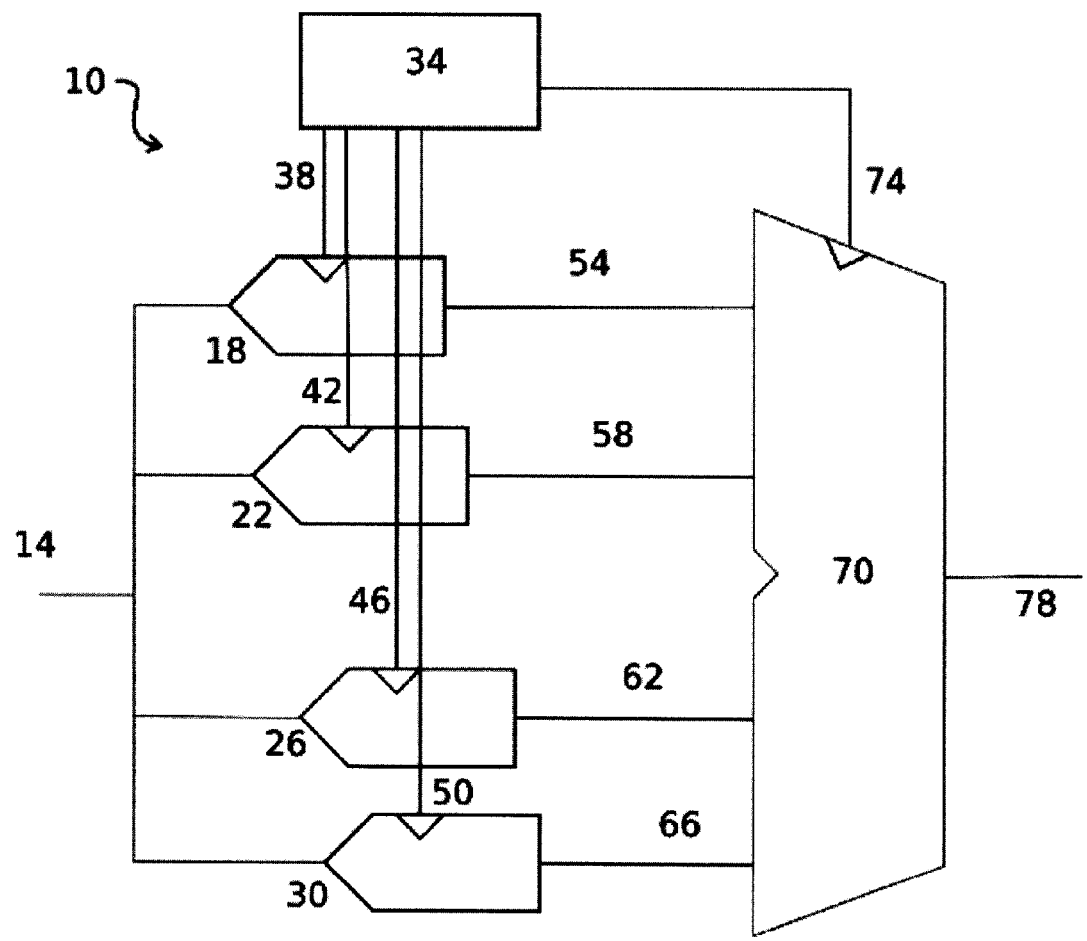
FIG. 1 shows a block diagram representation of a prior art multipath converter.

FIG. 1 shows a schematic representation of a prior art multipath analog to digital converter 10. An analog input signal 14 is applied to the inputs of a plurality of analog to digital subconverters (18, 22, 26 and 30). While multipath ADC 10 is shown as having four subconverters (18, 22, 26 and 30) it will be apparent to those of skill in the art that multipath ADC 10 can include more or fewer subconverters. A multiphase clocking circuit 34 provides clock signals 38, 42, 46 and 50 which define the times at which subconverters 18, 22, 26 and 30, respectively, sample analog input signal 14, producing uncorrected subconverter output streams 54, 58, 62 and 66 respectively. These subconverter output streams are multiplexed using multiplexer circuit 70, which is also clocked by a clock signal 74 generated by multiphase clocking circuit 34, into a single uncorrected multiplexed output stream 78.

It will be apparent to those of skill in the art that multiplexer circuit 70 may be omitted, or modified, if multipath digital signal processing techniques are used to replace conventional single-path signal processing techniques in dealing with uncorrected multiplex output stream 78.

Figure 2:
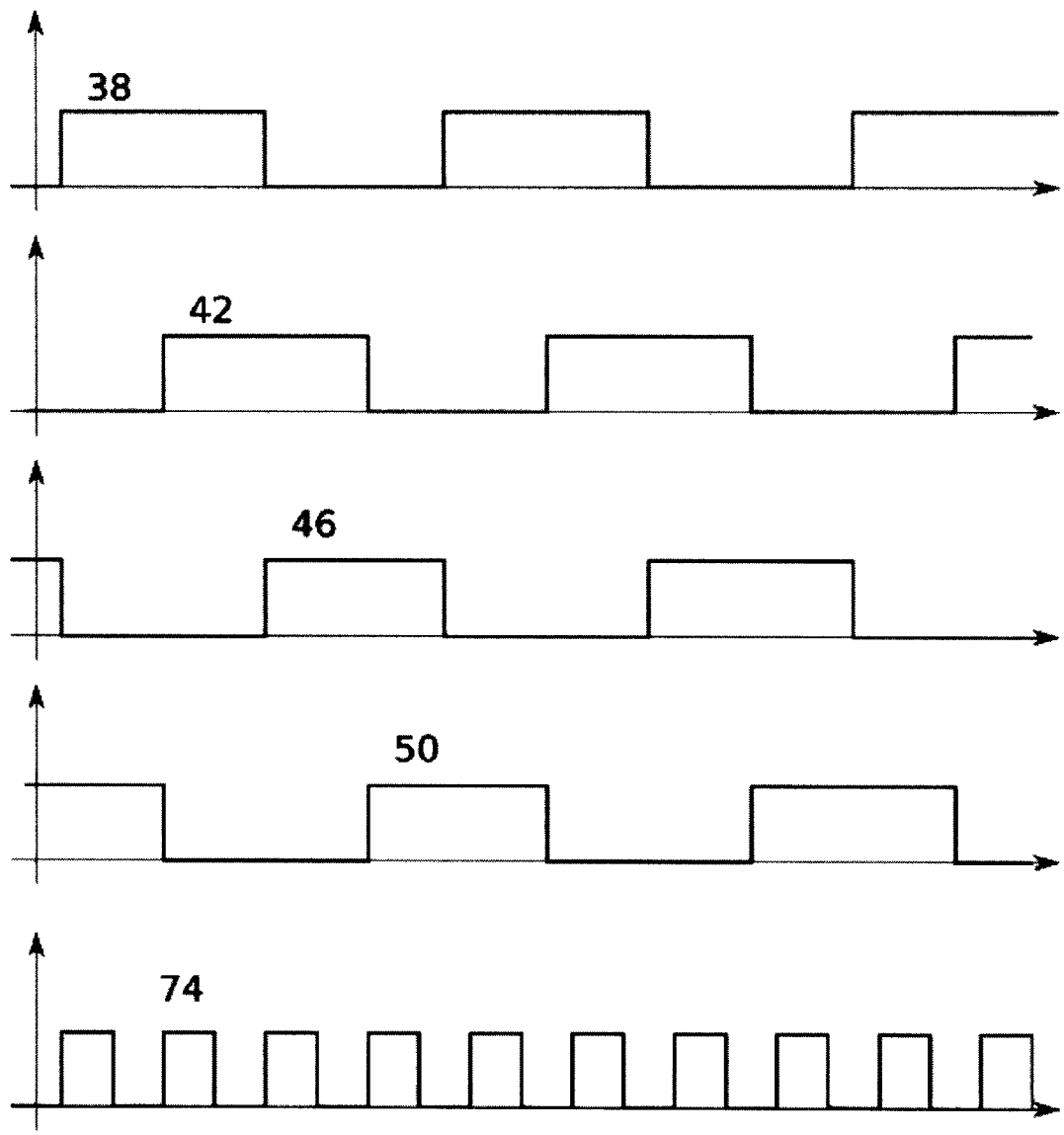
FIG. 2 shows a timing diagram representing prior art clocking for a multipath converter.

FIG. 2 shows a timing diagram representing prior art clocking for a multipath ADC such as ADC 10 of FIG. 1. Clock signals 38, 42, 46 and 50 are generated at nominal phase offsets of 360/N (where in this example N is four). If, for example, subconverters 18, 22, 26 and 30 sample their input signals at the rising edge of their respective clocks, new samples will be taken at a constant rate N times greater than the sample rate of any individual subconverter. This is the desired behavior of the prior art multipath ADC 10 described in FIG. 1, since relatively slow subconverters 18, 22, 26 and 30 are combined to provide a fast overall system.

FIG. 2 also shows clock signal 74, which operates at the overall system sample rate—in this example, four times as fast as the clock of any subconverter.

Figure 3:
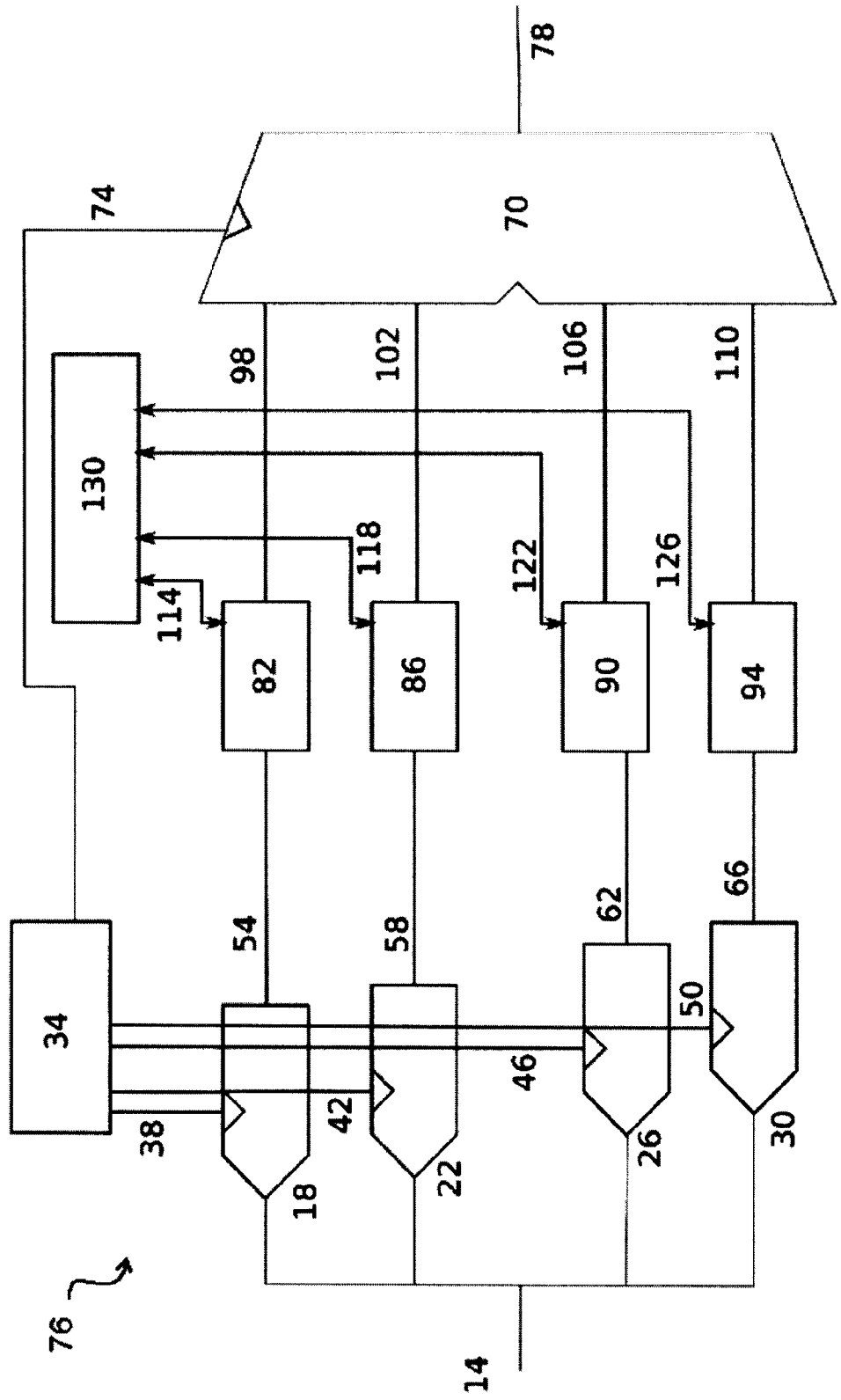
FIG. 3 shows a block diagram of a multipath ADC in accordance with the present invention.

Multiphase clocking circuits suitable to provide these signals are well known in the prior art, with many known variants. Further, it is well known that in practical systems this timing cannot be generated precisely and that, in consequence, the system of which the multipath ADC forms part is subject to errors which it may often be desirable to reduce or eliminate. In FIG. 3, a multipath ADC in accordance with the present invention is indicated generally at 76. In FIG. 3, components and signals similar to those of ADC 10 of FIG. 1 are indicated with like reference numerals. In multipath ADC 76 certain statistics, discussed further below, of each of the uncorrected subconverter (18, 22, 26 and 30) output streams 54, 58, 62 and 66 are estimated and corrected by a single-channel estimation and correction block (respectively blocks 82, 86, 90 and 94) to produce a corrected subconverter output stream (respectively streams 98, 102, 106 and 110). All of the single-channel estimation and correction blocks (82, 86, 90 and 94) communicate with an ensemble estimation block 130 using bidirectional paths (respectively paths 114, 118, 122 and 126).

Corrected subconverter output streams 98, 102, 106 and 110 are then processed by multiplexing or by multipath digital signal processing techniques, replacing the uncorrected subconverter output streams 54, 58, 62 and 66 for this purpose.

Figure 4:
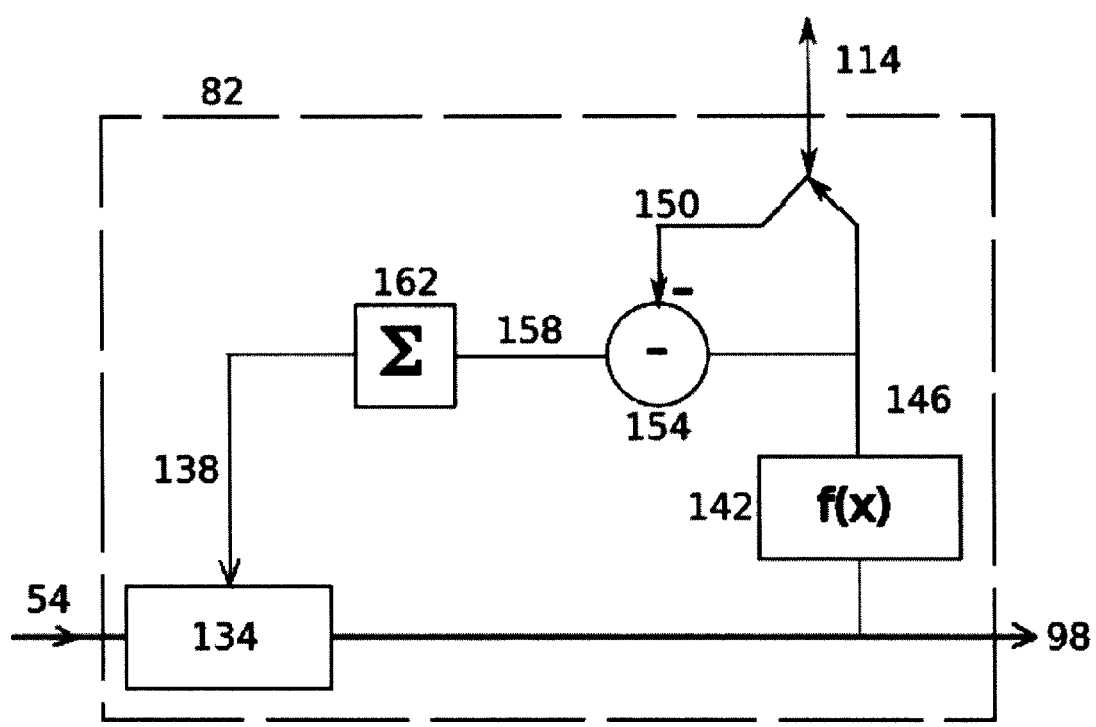
FIG. 4 shows a block diagram of one channel of a digital estimation and correction circuit using feedback in accordance with the present invention.

FIG. 4 shows an embodiment of single-channel estimation and correction block which is suitable for use in implementing any of blocks (82, 86, 90 and 94) of FIG. 3. In the illustrated example, single-channel estimation and correction block 82 is shown.

Uncorrected subconverter output stream 54 is modified by correction block 134, which combines it with feedback correction stream 138 to produce corrected subconverter output stream 98. An estimate of a single sample of a measure of a desired statistic is made in a measure block 142, producing measure stream 146. The particular function f(x) used to produce measure stream 146 should be selected by the designer such that the average value of measure stream 146 is the statistic (i.e.—mean, median, variance, bandwidth, etc.) of uncorrected stream 54 that the designer wishes to correct.

The measure stream 146 is passed up through bidirectional path 114 as an input to ensemble estimation block 130, which is operable to return ensemble measure average 150 (representing the average of the measure streams determined in each of blocks 82, 86, 90 and 94) through the bidirectional path 114. Ensemble measure average 150 is subtracted from the measure stream 146 by subtractor 154, whose output is error signal 158 which is passed to accumulator block 162. Accumulator block 162 is operable to accumulate the sum of all past error signals 158 to produce feedback correction stream 138.

Those skilled in the art should now recognize that the feedback loop implemented by single-channel estimation and correction block 82 is, if stable, operable to drive the average value of measure stream 146 to match the average value of ensemble measure average 150. Thus, if all single-channel estimation and correction blocks 82, 86, 90 and 94 share the same ensemble measure average 150, it follows that all channels will have the same average values for their measure streams. As will be apparent to those of skill in the art, in each of the feedback correction systems disclosed herein the signs about the respective feedback loop are selected to ensure that the feedback is negative, ensuring stability of the system.

It should also now be apparent to those skilled in the art that it is possible to correct several distinct statistical properties of a signal stream, for example by cascading estimation and correction circuits in an appropriate order. For example, the mean and the variance of uncorrected signal 54 can be corrected with a cascade of correction blocks provided that the mean of signal 54 should be corrected before its variance, since otherwise the corrections will undesirably interact.

It is contemplated that the function of correction block 134 can be implemented by modifying operation of the corresponding subconverter 18, for example by adding an input offset or by modifying a reference voltage.

Figure 5:
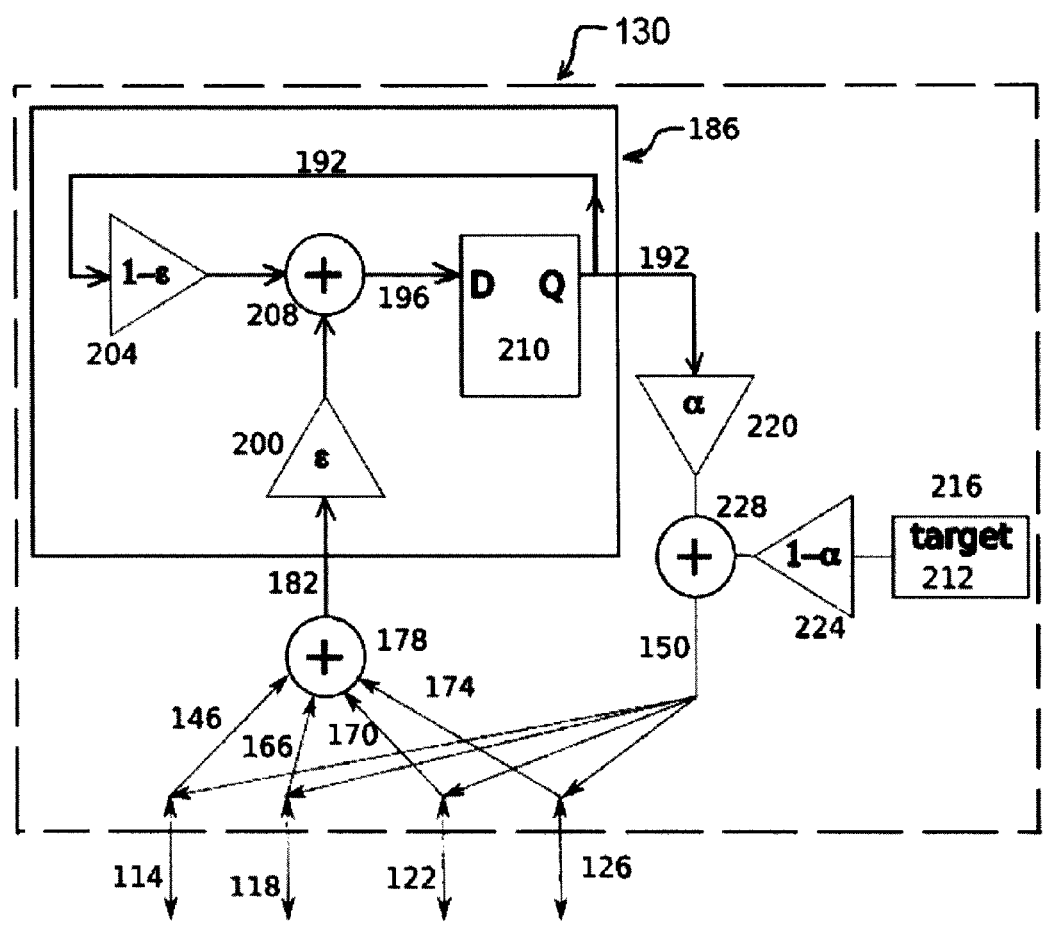
FIG. 5 shows a block diagram of an ensemble estimation block suitable for use with the circuit of FIG. 4.

FIG. 5 shows one embodiment of ensemble estimation block 130 suitable for use with multipath ADC 76 of FIG. 3. Ensemble estimation block 130 receives measure streams 146, 166, 170 and 174 on bidirectional paths 114, 118, 122 and 126 respectively. Measure stream 146 is generated in single-channel estimation and correction block 82 as was described explicitly with reference to FIG. 4 and measure streams 166, 170 and 174 are generated in the same manner in blocks 86, 90 and 94 which have the same structure and function as that of single-channel estimation and correction block 82.

Ensemble estimation block 130 employs a summing means 178 to provide a summed measure stream 182, which is then filtered using a lowpass filter 186 to produce estimate 192 of the average of all measure streams over time.

A detailed embodiment of lowpass filter 186 is shown for clarity, though many types of structures for lowpass filters are known and will be apparent to those of skill in the art. In the embodiment of FIG. 5, summed measure stream 182 is combined in a weighted sum with estimate 192 of all measure streams to form a new estimate 196 of the average of all measure streams over time. The weighting of summed measure stream 182 is performed with a gain block 200 which will typically have a very small gain E and the weighting of estimate 192 is performed with a gain block 204 which will typically have a gain very near to, but slightly less than, one and advantageously having a gain complementary to that of gain block 200.*i.e.*—a gain of (1-$\epsilon$), in the sense that the two gains add to unity. Summation of the two weighted values is performed in an adder 208, thus producing the desired new estimate 196 of the average of all measure streams over time. When the new estimate 196 is available, a register 210 is clocked to update estimate 192 and the process is repeated.

Ensemble measure average 150, which is what is required by single-channel estimation and correction blocks 82, 86, 90 and 94, is generated as a weighted sum of estimate 192 of the average of all measure streams over time with a target value 212, appropriately selected by the designer, which is stored in a register 216. Estimate 192 is weighted by a gain block 220 and target value 212 is weighted by a gain block 224 and the gains of these blocks may advantageously sum to unity (as shown in the Figure). However, as those skilled in the art will understand, well-known signal flow graph manipulations may be applied to the design of the system to produce an infinity of mathematically equivalent systems. The weighted values from gain block 220 and gain block 224 are summed by an adder 228, producing desired ensemble measure average 150.

As a special case, if gain block 220 has a gain of zero, the whole of ensemble estimation block 130 just produces target value 212 and almost all of the circuitry can be eliminated; in fact target value 212 can, in this, case be stored locally in single-channel estimation and correction blocks 82, 86, 90 and 94, making ensemble estimation block 130 unnecessary. This corresponds to a strategy of correcting the statistical measure to a fixed value regardless of the actual input signal, for example to zero mean or unity variance. This strategy may mask the effect of failures affecting analog input signal 14 and therefore is not usually desirable.

As will also now be apparent to those of skill in the art, in principle it is possible to instead choose zero as the gain of gain block 224, so that target value 212 is irrelevant, but this is typically undesirable because numerical errors in computations may then cause drifts of ensemble measure average 150 to impractical values.

Figure 6:
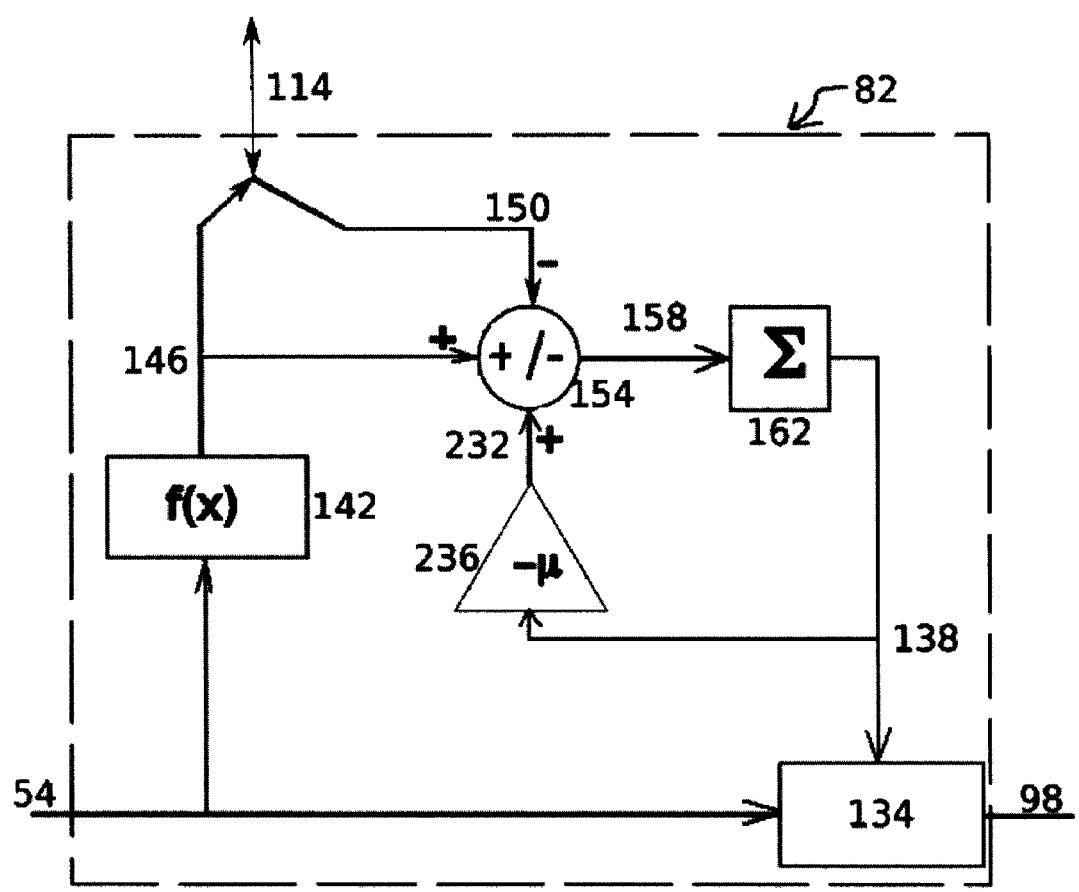
FIG. 6 shows a block diagram of one channel of a digital estimation and correction circuit using feedforward in accordance with the preset invention.

FIG. 6 shows another embodiment of one channel of a digital estimation and correction circuit, in this specific example circuit 82, using feedforward as an alternative to the feedback structure of FIG. 4. Just as in the feedback implementation of FIG. 4, uncorrected subconverter output stream 54 is modified by correction block 134, which combines it with feedback correction stream 138 to produce corrected subconverter output stream 98. An estimate of a single sample of a measure of a desired statistic is still made in a measure block 142, producing measure stream 146. Measure stream 146 should again be selected by the designer such that the average value of measure stream 146 is the statistic that the designer wishes to correct.

Measure stream 146 is passed through bidirectional path 114 as an input to ensemble estimation block 130 (not shown in FIG. 6) and is also subtracted from ensemble measure average 150 obtained from ensemble estimation block 130 through bidirectional path 114. This subtraction is performed by a subtractor 154, whose output, error signal 158, is passed to accumulator block 162. Accumulator block 162 is operable to accumulate the sum of all past error signals 158 to produce feedback correction stream 138.

In contrast to the feedback system described with reference to FIG. 4, in this feedforward system measure block 142 is applied to the uncorrected subconverter output stream 54, rather than the corrected subconverter output stream 98, and for this reason the effect of corrections does not appear in measure stream 146. This effect is compensated by adding a compensation signal 232, derived by multiplying the feedback correction stream 138 by a small constant $\mu$ in gain block 236, where $\mu$ is calculated a priori so that compensation signal 232 will approximate the difference between statistical measures taken from uncorrected subconverter output stream 54 and corrected subconverter output stream 98. Without compensation signal 232, the feedforward loop would not be stable as corrections applied by correction block 134 would not affect error signal 158 and therefore accumulator block 162 could increment or decrement without bound.

Figure 7:
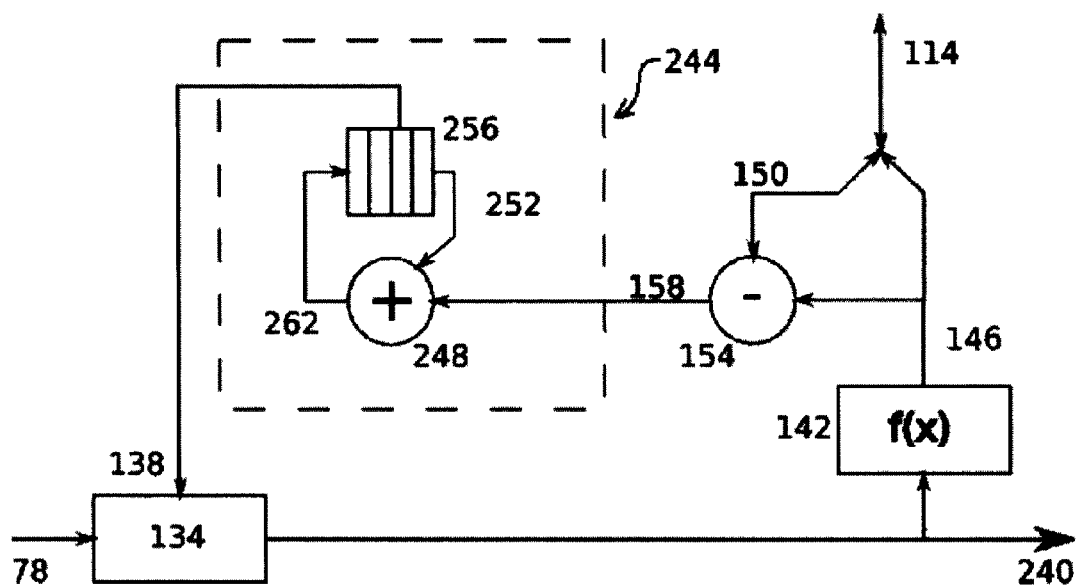
FIG. 7 shows a block diagram of another digital estimation and correction system in accordance with the present invention wherein corrections are applied to the multiplexed data stream rather than to individual channels.

FIG. 7 shows another embodiment the present invention wherein corrections are applied to the uncorrected multiplexed data stream 78, rather than to individual uncorrected subconverter output streams 54, 58, 62 and 66, and the result is a corrected multiplexed data stream 240.

The structure of this estimator and corrector for multiplexed data stream 78 is similar to the feedback structure of FIG. 4 and similar components and signals are indicated with like reference numerals, but now all memoryless functions are shared for all channels while per-channel state is stored in a shift register and correction block 134 operates on uncorrected multiplexed data stream 78, according to feedback correction stream 138, to provide corrected multiplexed data stream 240.

As in FIG. 4, an estimate of a single sample of a measure of a desired statistic is made in measure block 142, producing measure stream 146. Measure stream 146 should be selected by the designer such that its average value is the statistic that the designer wishes to correct.

Measure stream 146 is passed through bidirectional path 114 as an input to ensemble estimation block 130 (not shown in FIG. 7) and is also subtracted from ensemble measure average 150 obtained from ensemble estimation block 130 through bidirectional path 114. Subtraction is performed by subtractor 154, whose output is error signal 158 which is passed to a cyclic accumulator 244.

Cyclic accumulator 244 is operable to accumulate the sum of all error signals 158 corresponding to each individual channel (for example uncorrected subconverter output streams 54, 58, 62 and 66 in FIG. 1), separately for each channel, to produce a feedback correction stream 138 that is appropriate for each individual channel of uncorrected multiplexed data stream 78.

Those skilled in the art will recognize that several embodiments of cyclic accumulator 244 are possible, and the embodiment shown in FIG. 7 is merely a preferred implementation. Error signal 158 is applied to one input of an adder cell 248, of which the other input is the current value 252 of feedback correction stream 138 for the respective individual channel with error signal 158. This current value 252 of feedback correction stream 138 is taken from the final stage of an N-element shift register 256, where N is the number of subconverters. In the specific illustrated example, N is four. The output of adder cell 248 is a new value 262 of feedback correction term 138 for the respective individual channel with error signal 158 and is applied to the input of N-element shift register 256.

The appropriate value of feedback correction term 138 for the next individual channel is also taken from N-element shift register 256. The appropriate stage from which to take feedback correction term 138 is dependent on the overall latency of the implementation of the entire loop: for example, if correction block 134 has a single cycle of latency and other stages are combinational, then feedback correction term 138 may be taken from stage N−1 (3 in the present example) of N-element shift register 256. One skilled in the art will recognize that it may be advantageous to pipeline the loop, adding latches at other points, and that it may then be necessary to compensate for this pipelining by taking feedback correction term 138 from an earlier stage in N-element shift register 256.

Operation of ensemble estimation block 130 suitable for use with the multiplexed estimation and correction circuit of FIG. 7 is still as shown in FIG. 5, except that bidirectional paths 118, 122, 126, and measure streams 166, 170 and 174 are no longer required, and therefore summing means 178 is not required either; and measure stream 146 may be passed directly in to gain block 200 in place of signal summed measure stream 182.

It should now be apparent to those skilled in the art that the fully multiplexed estimation and correction circuit of FIG. 7 and the individual-channel estimation and correction block of FIG. 4 represent two extremes of multiplexing, and that designs with intermediate degrees of multiplexing may be desirable in that they allow a tradeoff between speed and complexity. In the discussions below, for reasons of brevity and clarity, examples of only the fully multiplexed form are shown, but it will be understood that the present invention is not so limited.

Figure 8:
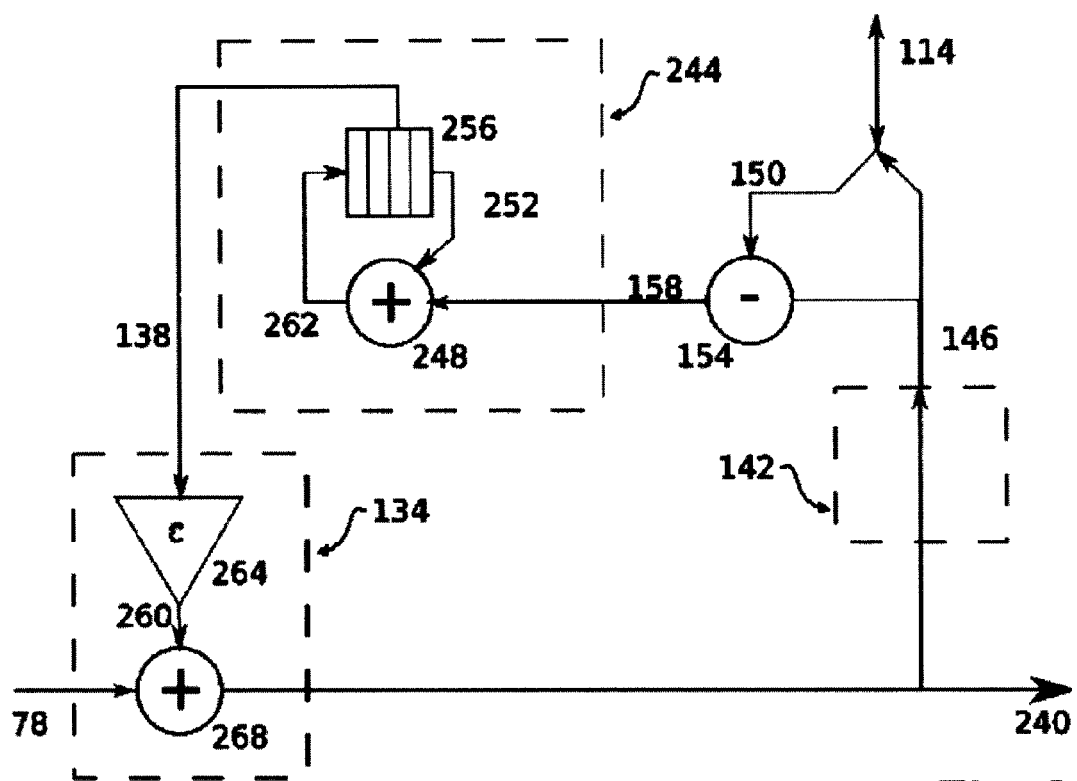
FIG. 8 shows a block diagram of measure and correction blocks, in accordance with the present invention, operable to compensate for mismatches in subconverter offset voltages.

FIG. 8 shows another embodiment of measure and correction blocks, in accordance with the present invention, which are operable to compensate for mismatches in subconverter offset voltages, and similar components to those of FIGS. 4 and 7 are indicated with like reference numerals. In this embodiment, correction block 134 is implemented by adding a scaled correction signal 260 of feedback correction stream 138 to uncorrected multiplexed data stream 78, the scaling being performed by a digital gain block 264 with a gain of c. One skilled in the art will recognize that a simple bit-shift may be used to efficiently implement the digital gain block 264. Addition is performed by an adder 268, producing corrected multiplexed data stream 240.

Measure block 142 is, in this special case of offset correction, operable to simply pass the value of corrected multiplexed data stream 240 through as measure stream 146. One skilled in the art of statistical estimation will recognize that the circuit of FIG. 8 is operable to correct the means of individual channels, and can readily be modified to correct their medians. In one embodiment to implement the correction of medians, it is sufficient to replace subtractor 154 with a cell that calculates the signum of the difference between its inputs, rather than the difference itself.

Figure 9:
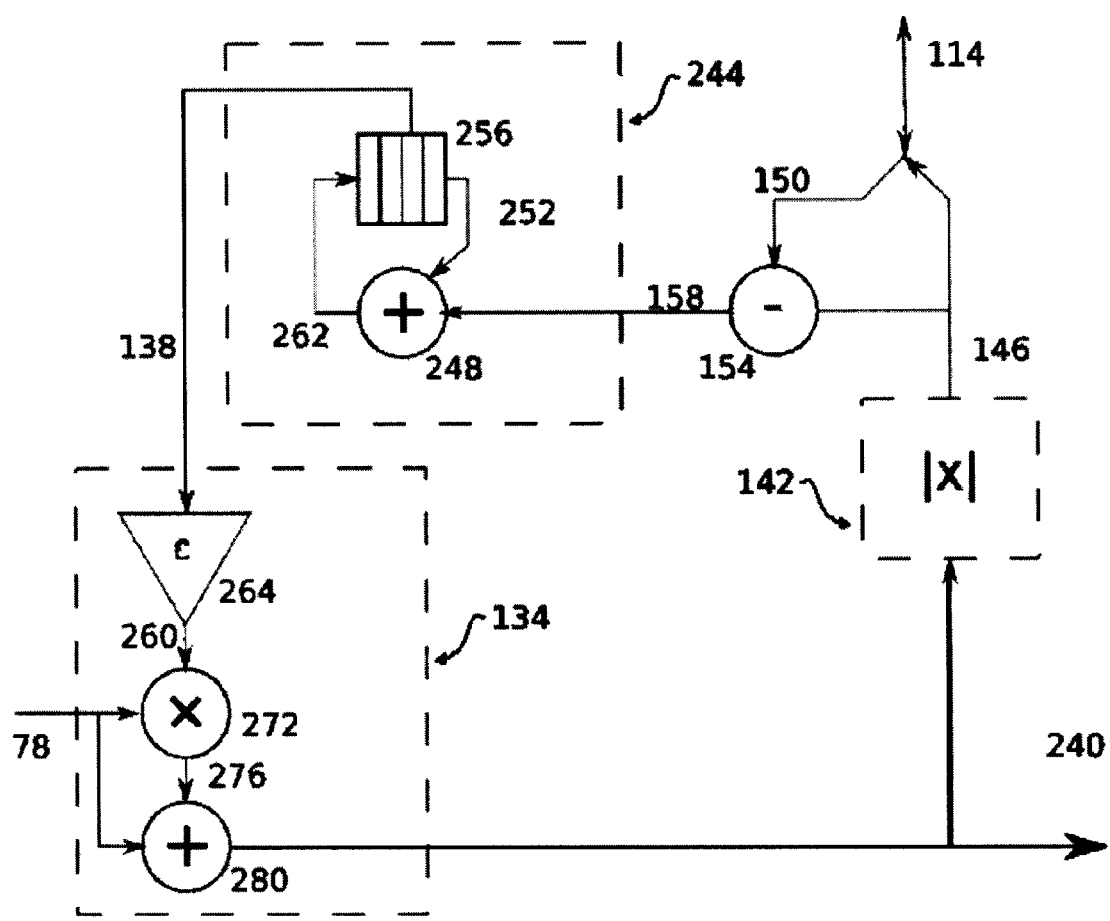
FIG. 9 shows a block diagram of measure and correction blocks, in accordance with the present invention, operable to compensate for mismatches in subconverter gains.

FIG. 9 shows another embodiment of measure and correction blocks, in accordance with the present invention, which are operable to compensate for mismatches in subconverter gains, and similar components to those of FIGS. 4 and 7 are indicated with like reference numerals. In this embodiment, correction block 134 is operable to multiply uncorrected multiplexed data stream 78 by an amount depending on feedback correction stream 138. Feedback correction stream 138 is first scaled down by digital gain block 264 to yield scaled correction signal 260, just as for offset correction, but this scaled correction signal 260 is now applied to a multiplier cell 272 yielding a product term 276. Product term 276 is now combined in adder 280 with uncorrected multiplexed data stream 78 to provide corrected multiplexed data stream 240.

Measure block 142 is operable to calculate the absolute value of corrected multiplexed data stream 240 suitable implementations of this function are well known, for example the most significant bit (MSB) of corrected multiplexed data stream 240 may be applied to the control of a multiplexer to choose between passing corrected multiplexed data stream 240 or its negative as measure stream 146.

One skilled in the art of statistical estimation will recognize that measure block 142 may instead be chosen to calculate the square of its input and that the overall loop will still be operable to correct the gain levels of uncorrected multiplexed data stream 78.

One skilled in the art of statistics will understand that it is usually desirable to correct the mean of a signal before correcting its gain, as errors in the mean affect estimates of the gain. This can be accomplished in several ways, for example by cascading blocks so that an offset-correction block precedes a gain-correction block.

Figure 10A:
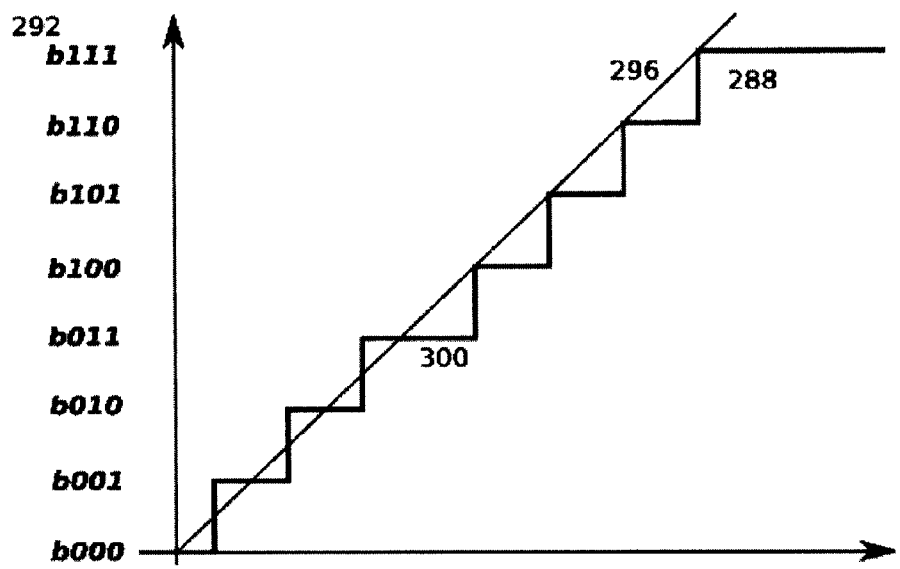
FIGS. 10a and 10b show a representation of exemplary DNL error at the most-significant-bit transition and a desired digital correction.
Figure 10B:
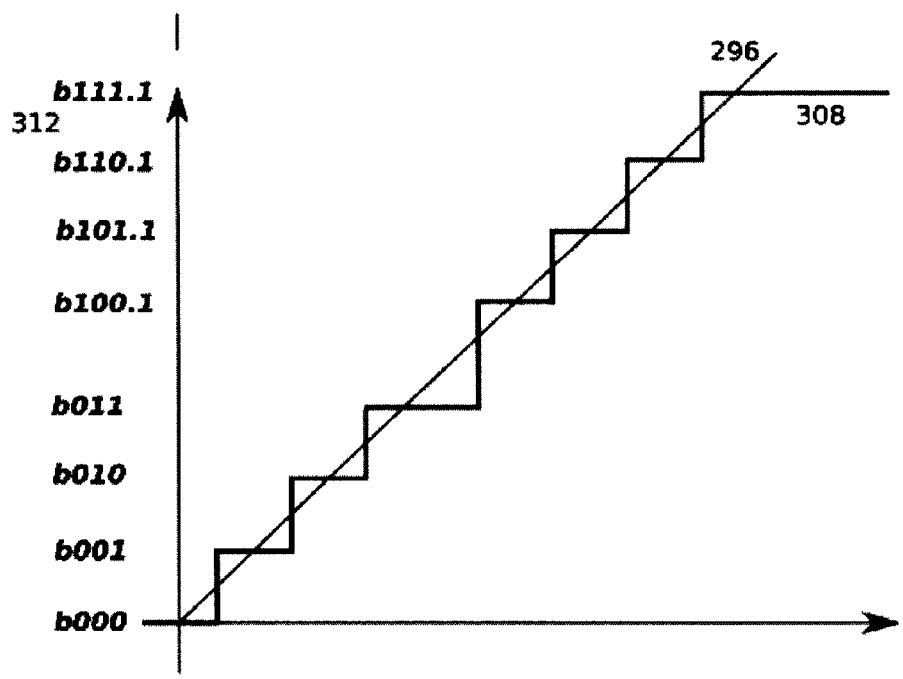

FIGS. 10a and 10b show exemplary DNL error at the MSB transition and desired digital correction. In FIG. 10a, the input-output relationship 288 between analog input (on the abscissa) and digital output (on the ordinate) for an exemplary three-bit analog-to-digital converter. The binary output codes 292 produced by the three-bit analog-to-digital converter are shown as "b000", "b001", etc.

The input-output relationship for this converter would ideally approximate linear relation 296 as closely as possible over a certain range of the abscissa, and hence should ideally be in the form of a regular staircase with eight "steps" separated by seven evenly-spaced "risers". Practical analog-to-digital converters deviate from this ideal form and, in particular, many types of converters are known to exhibit uneven "riser" spacing, with the worst deviation likely to occur at the MSB—in this case from "b011" to "b100"—as illustrated by the long "step" 300. In a multipath converter each subconverter may be expected to have this problem to a different extent, so each must be corrected individually. It is desirable to mitigate this effect.

FIG. 10b shows a modified input-output curve 308 more closely approximating linear relation 296, obtained from input-output relationship 288 by modifying only the ordinate values to the set 312. These new ordinate values are shown using a "binary point" notation, in which for example "b110.1" represents decimal value 6.5. It is desired to find a circuit capable of measuring the extent to which the long "step" 300 varies from ideality and correcting it digitally as exemplified in FIG. 10b.

Modifying ordinate values can be done entirely by digital operations and one skilled in the art will recognize that, if it is possible to trim components of the analog-to-digital subconverter, it will in principle be possible to correct input-output relationship 288 to an ideal staircase.

Figure 11:
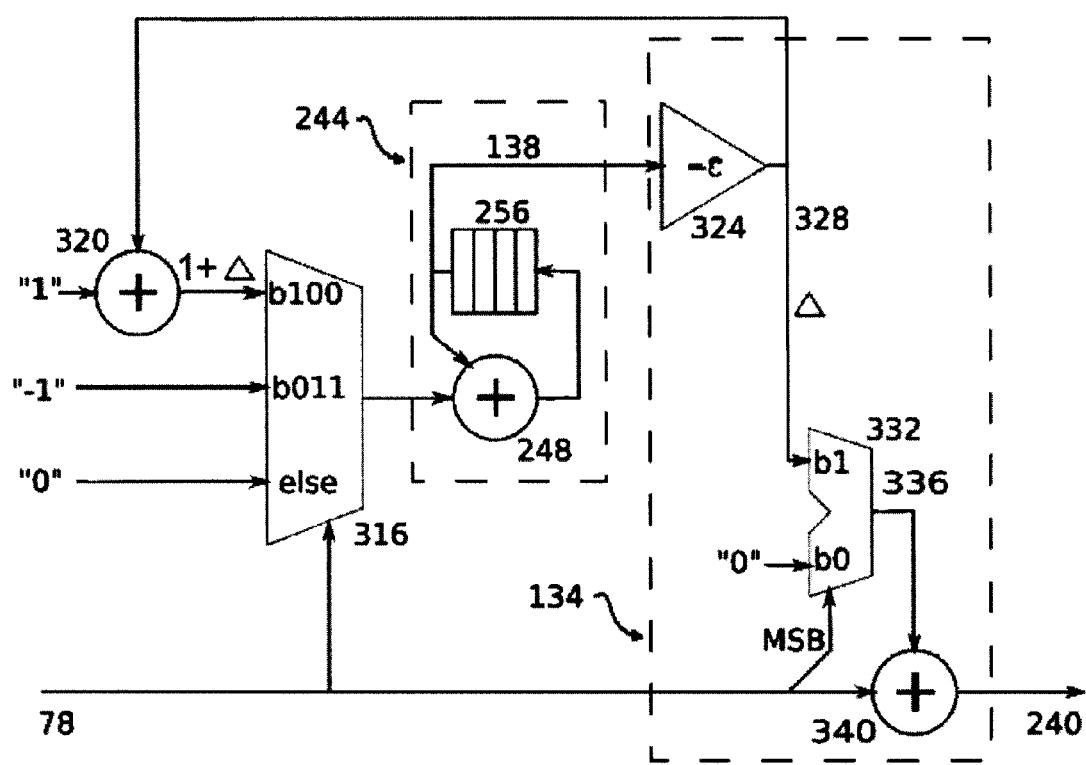
FIG. 11 shows a block diagram of measure and correction blocks, in accordance with the present invention, operable to compensate for subconverter DNL at the most-significant-bit transition.

FIG. 11 shows another embodiment of measure and correction blocks, in accordance with the present invention, which are operable to compensate for subconverter differential non linearity (DNL) at the MSB transition, each subconverter possibly having distinct DNL and like components to those discussed above are indicated with like reference numerals. The embodiment shown is in feedforward form operable to act on uncorrected multiplexed data stream 78 to produce corrected multiplexed data stream 240, however it will also be apparent to hose of skill in the art that a feedback form can also be employed.

In the embodiment of FIG. 11, uncorrected multiplexed data stream 78 is applied to the selection input of multiplexer 316. In the case that its value is binary "b011" (corresponding to long "step" 300 at the output of the exemplary three-bit converter of FIG. 10a), a fixed value corresponding to −1 is selected. In the case that its binary value is "b100", the output of an adder 320 is selected and in all other cases a value corresponding to zero is selected.

The selected value is applied as an input to cyclic accumulator 244, which comprises adder 248 and N-element shift register 256 connected in a cyclic accumulation loop, as described above with reference to FIG. 7, and having feedback correction term 138 as an output which in turn serves as the correction input to correction block 134. Within correction block 134, feedback correction stream 138 is applied to a digital gain block 324 having small gain ϵ and output scaled correction signal 328. The value of this output signal, labeled Δ for mathematical convenience, is the amount by which the circuit will adjust converter output values in the case that the MSB of the uncorrected multiplexed data stream value is a "one." In the embodiment shown, this is implemented by applying the MSB of uncorrected multiplexed data stream 78 to the selection input of a multiplexer 332, output scaled correction signal 328 to the "1" input, and a mathematical zero to the "0" multiplexer input. In this way a correction term is produced which may be added, in an adder 340, to uncorrected multiplexed data stream 78 to produce corrected multiplexed data stream 240.

Output scaled correction signal 328, Δ, is also fed back to an input of adder cell 320, whose other input is a mathematical "one", thus the "b100" input of multiplexer 316 receives value "1+Δ".

Figure 12:
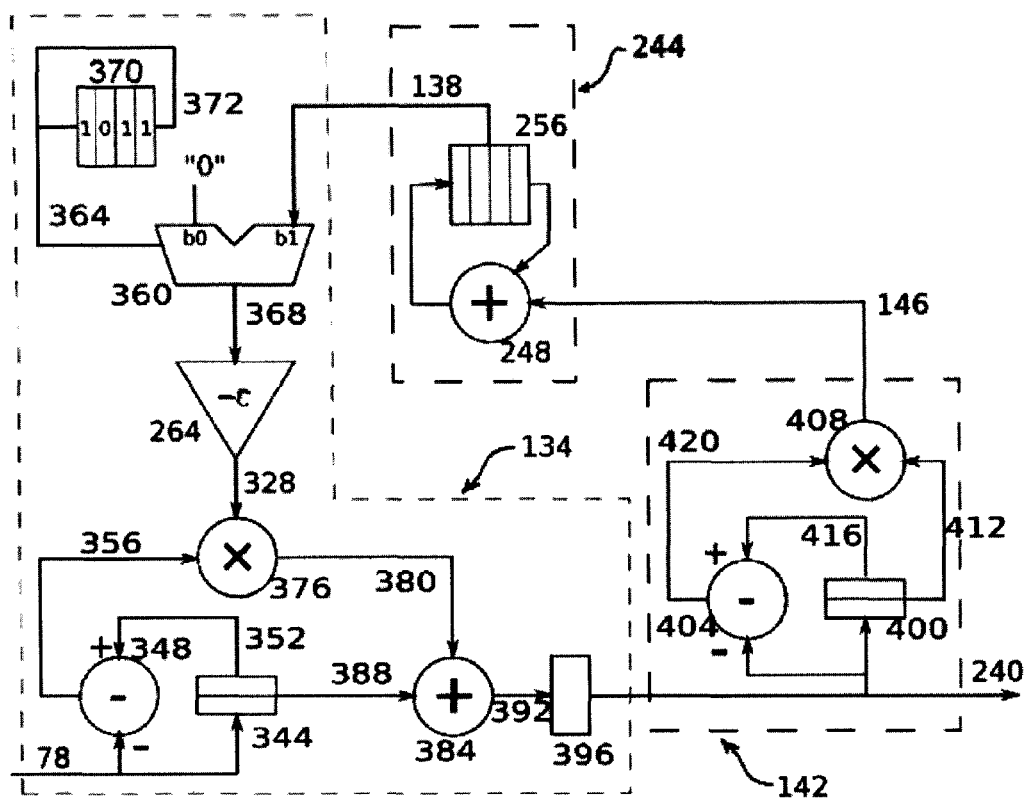
FIG. 12 shows a block diagram of measure and correction blocks, in accordance with the present invention, operable to compensate for errors in uniformity of sample timing.

FIG. 12 shows another embodiment of measure and correction blocks, in accordance with the present invention, which are operable to compensate for errors in uniformity of sample timing, and like components to those discussed above are indicated with like reference numerals. The embodiment shown is in a feedback form and is operable to act on uncorrected multiplexed data stream 78 to provide corrected multiplexed data stream 240, however it will also be apparent to hose of skill in the art that a feedforward form can also be employed.

In general terms, the embodiment of FIG. 12 forces the correlation of the signal with its own derivative to zero. This is a statistical property that may be expected to hold in some common cases, such as when stationary signals are sampled uniformly, and which does not hold for oversampled stationary signals sampled non-uniformly. In the embodiment of FIG. 12, the derivative of a signal is estimated by subtracting it from a doubly-delayed version of itself, but one skilled in the art will recognize that other estimates of a derivative are known and may be substituted without substantially changing the operation of the measure and correction blocks.

When correcting timing errors with the measure and correction blocks of FIG. 12, it is important to avoid a "drift" of output timings. Mathematically, if any set of timings is uniformly spaced, a new set of uniformly spaced timings can be obtained by shifting all timings together by an equal amount, and a circuit that makes timing uniform may, for example in the presence of numerical noise, slowly undesirably increment or decrement all timings together until some practical limit is reached. In the embodiment of FIG. 12 this problem is solved by "pinning" one phase timing to stay uncorrected while the others adjust around it. One skilled in the art will recognize that other constraints may alternatively be applied, for example forcing the sum of all timing adjustment to be zero.

In correction block 134, uncorrected multiplexed data stream 78 is applied to an input two-stage shift register 344 and to one input of a difference circuit 348. The other input of difference circuit 348 is from a doubly-delayed output 352 of the input two-stage shift register 344. Difference circuit 348 is operable to produce a derivative-estimate output 356 equal to the value of doubly-delayed output 352 minus uncorrected multiplexed data stream 78.

Within correction block 134, feedback correction term 138 is applied to the "one" input of a pinning multiplexer 360, while a mathematical zero is applied to the "zero" input. A pinning-phase selection stream 364 is applied to the correction input, such that a pinned correction signal 368 is equal to a mathematical zero for one phase, and is equal to feedback correction term 138 for all other phases.

Pinning-phase selection stream 364, in this embodiment, is generated as the output of an N-stage single-bit shift register 370 whose initial state is forced to have a single zero corresponding to the phase that it is desired to "pin" and N−1 "ones". In other embodiments, some convenient phase signal, such as clock signal 38 shown in FIG. 1, can be advantageously used for this purpose.

Pinned correction signal 368 is applied to a digital gain block 264 having small negative gain −ϵ and having as its output scaled correction signal 328. Output scaled correction signal 328 and derivative-estimate output 356 are applied to the inputs of a first multiplier circuit 376 to produce a correction stream 380, which is then applied to one input of a first adder circuit 384.

A singly-delayed copy 388 of uncorrected multiplexed data stream 78 is taken from the first input two-stage shift register 344 and applied to the second input of the first adder circuit 384, producing an advanced corrected data stream 392. This advanced corrected data stream 392 may optionally be applied to a pipeline register 396 to produce corrected multiplexed data stream 240, which is in this case delayed by two samples relative to the input as well as corrected for errors in uniformity of sample timing.

The use of pipeline registers is known in the art of digital circuit design to enable increased clock rates, which may be expected to be desirable when designing correction circuits for multipath analog-to-digital converters. It will be known to those skilled in the art that pipelining registers can be placed at various points in a circuit, depending on speed requirements and the detailed timing characteristics of individual subcircuits, and so it will be understood that the particular placement of pipeline register 396 in this embodiment is strictly illustrative and is not intended to limit the scope of the present invention.

As is known, when adding pipeline registers it is necessary to take care not to change the function of the circuit. Advantageously, in this embodiment it is possible to change the "pick-off point" of feedback correction stream 138 from N-element shift register 256 (to be discussed below) to compensate for any amount of pipelining.

Corrected multiplexed data stream 240 is passed into measure block 142, which in this embodiment comprises a second two-stage shift register 400, a second subtractor 404 and a second multiplier 408. Second two-stage shift register 400 is operable to produce a singly-delayed corrected data stream 412 and a doubly-delayed copy 416 of corrected multiplexed data stream 240. Second subtractor 404 is operable to subtract corrected multiplexed data stream 240 from its doubly-delayed copy 416 to produce a second derivative-estimate 420. Second multiplier 408 is operable to multiply second derivative-estimate 420 by singly-delayed corrected data stream 412 to produce measure stream 146.

As described above, with respect to FIG. 7, cyclic accumulator 244 comprises N-element shift register 256 and adder 248 and is operable to integrate phases of measure stream 146 independently, forming an independent estimate of the desired statistic for each phase of data conversion. For the particular example of the embodiment of FIG. 12, feedback correction stream 138 is taken from the output of stage N−2 of N-element shift register 256, this choice of "pick-off point" two stages ahead of the update currently being performed is operable to compensate for the two delays (pipeline register 396 and the first stage of second two-stage shift register 400) between singly-delayed copy 388 and singly-delayed corrected data stream 412.

Figure 13:
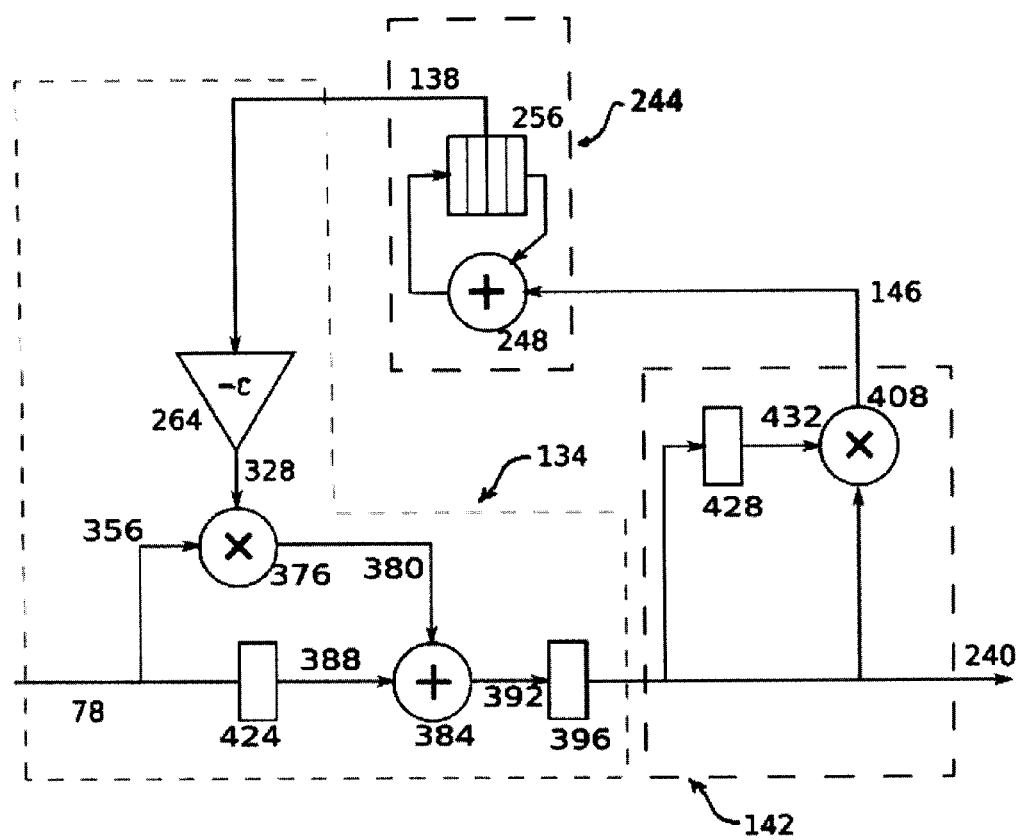
FIG. 13 shows a block diagram of measure and correction blocks, in accordance with the present invention, operable to compensate for mismatches in subconverter bandwidth.

FIG. 13 shows another embodiment of measure and correction blocks, in accordance with the present invention, which are operable to compensate for mismatches in subconverter bandwidth, and like components to those discussed above are indicated with like reference numerals. The embodiment shown is in a feedback form and is operable to act on uncorrected multiplexed data stream 78 to provide corrected multiplexed data stream 240, however it will also be apparent to hose of skill in the art that a feedforward form can also be employed.

In general terms, the measure and correction blocks of FIG. 13 force the correlation of the signal with a delayed version of itself to zero and this is a special case of "whitening", in which correlations with several delayed versions are forced to zero.

Practical analog-to-digital converters have finite bandwidth, and therefore induce some correlation from one sample to the next even when the original signal is "white". In practical multipath converters the bandwidth can be expected to vary from one subconverter to another, causing these correlations to depend on sampling phase—which is usually an undesirable distortion. If all correlations are forced to zero, then a fortiori they will all be forced to be identical and bandwidth distortion will have been compensated.

The bandwidth correction embodiment of FIG. 13 comprises a feedback connection of a correction block 134, a measure block 142 and a cyclic accumulator 244.

Correction block 134 comprises a first delay register 424, first multiplier circuit 376, digital gain block 264, first adder circuit 384 and pipeline register 396. Feedback correction stream 138 is multiplied by a small negative constant −ε in digital gain block 264 to produce output scaled correction signal 328, which is applied to one of the inputs of said first multiplier circuit 376; and uncorrected multiplexed data stream 78 is applied to the other input of first multiplier circuit 376. The output of first multiplier circuit 376 is correction stream 380.

Uncorrected multiplexed input signal 78 is delayed by one sample in first delay register 424 producing a singly-delayed copy 388, which is summed with correction stream 380 in first adder circuit 384 to produce advanced corrected data stream 392, which in turn is applied to pipeline register 396 to produce corrected multiplexed data stream 240.

Corrected multiplexed data stream 240 is passed into measure block 142, where a copy is delayed by one sample in a second register 428 to provide a delayed corrected multiplexed signal 432, which is in turn multiplied by corrected multiplexed data stream 240 in second multiplier 408 to provide measure stream 146.

Measure stream 146 is integrated on a per-phase basis in cyclic accumulator block 244 as described above, with reference to FIG. 7. As was described above with reference to FIG. 12, the pickoff point for feedback correction term 138 within N-element shift register 256 is selected to compensate for processing and pipelining delays—in this example the appropriate choice is to take feedback correction stream 138 from stage N−2 (stage 2 in the running 4-phase example) so as to compensate for pipeline register 396 and second register 428.

Practical systems are often oversampled, such that even with ideal analog-to-digital converters some correlation would be expected from one sample to the next. If it is desired to maintain this property then an ensemble estimation block such as described above with reference to FIG. 5 can be used, and the path from measure block 142 to cyclic accumulator 244 augmented with a subtractor 154 and bidirectional path 114 as described above with reference to FIG. 4.

Figure 14:
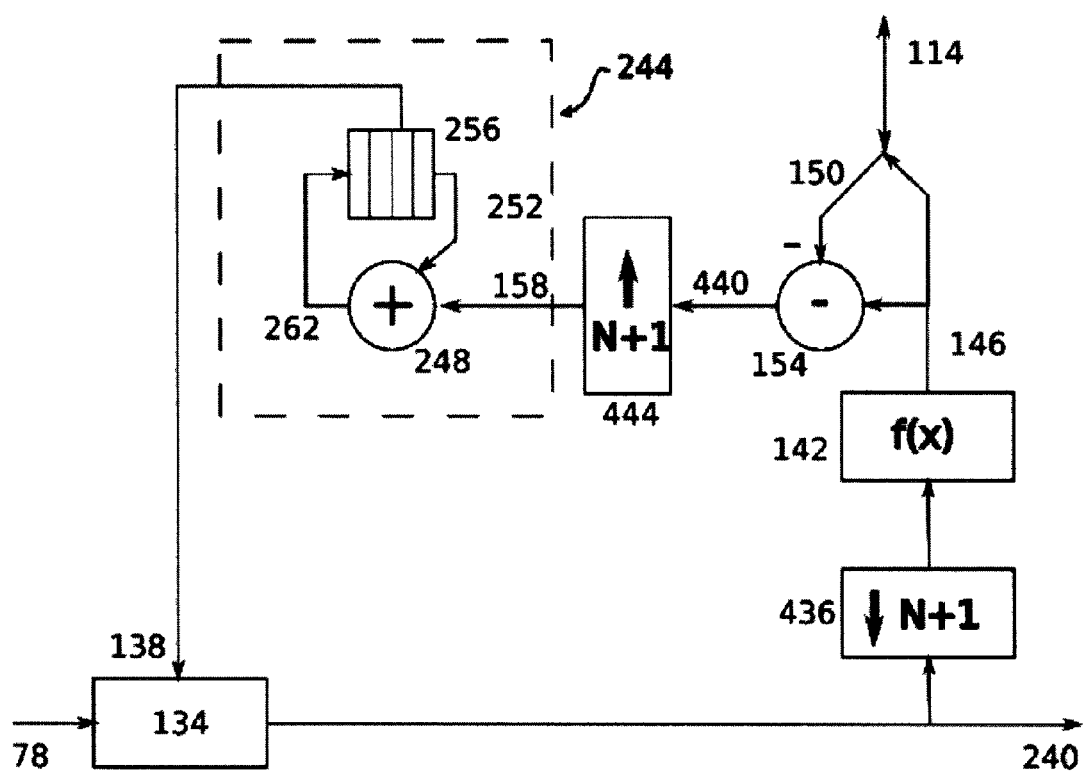
FIG. 14 shows a block diagram of the use of subsampling to reduce computational load and hence speed and power requirements.

FIG. 14 shows a use of subsampling with measure and correction blocks in accordance with the present invention to reduce computational load and hence speed and power requirements. The embodiment shown is for feedback correction of a multiplexed signal and is based on the structure of FIG. 7, which in turn can be specialized to produce the architectures of FIGS. 9, 11, 12 and 13. One skilled in the art will recognize that the feedforward structure of FIG. 6 and unmultiplexed structure of FIG. 3 can also benefit from subsampling and, in general, subsampling can be applied to all of the correction circuits disclosed herein.

Some care is required in the downsampled implementation of measure block 142 in the cases (such as for timing and bandwidth correction, cf. FIGS. 12 and 13) in which measure block 142 uses registers to produce delayed versions of signals. In these cases the delay must usually be calculated at the full rate and downsampled together with corrected multiplexed data stream 240.

As in the earlier embodiments, uncorrected multiplexed data stream 78 and feedback correction term 138 are applied to correction block 134 to produce corrected multiplexed data stream 240. Corrected multiplexed data stream 240 is then subsampled in a subsampler 436 by a ratio mutually prime to N (the number of subconverters). In the illustrated embodiment, the exemplary subsampling ratio is $N_{+1}$. Subsampler 436 is operable to ignore N samples and then pass the next sample to measure block 142 at its output, such that circuits driven by it (measure block 142, subtractor 154 and any circuitry connected to bidirectional path 114) need only operate at a speed $1/(N_{+1})$ that of the corrected multiplexed stream. This is the principal advantage of this technique. Measure block 142, subtractor 154 and those circuits connected to bidirectional path 114 have the same roles as before, but are updated less often.

The output downsampled error measure output 440 of subtractor 154 is upsampled in an upsampling block 444 by the same factor by which signals were subsampled in subsampler 436; i.e.—N+1 in the shown embodiment—to produce error signal 158 operable as the input of cyclic accumulator 244, which operates as discussed above. Upsampling block 444 is mathematically defined to reproduce its input but also to introduce a sequence of N zeros between each sample of the input. Those skilled in the art will recognize that this function may advantageously be combined with that of adder 248 to reduce the required operating rate of the latter.

Figure 15:
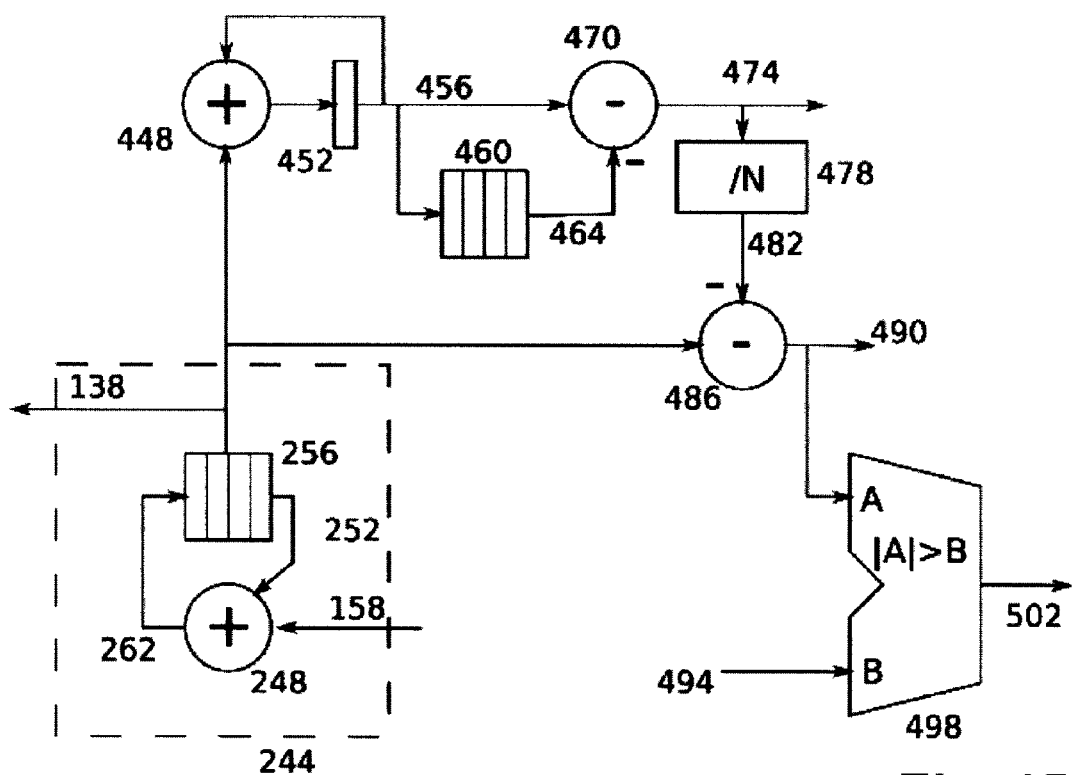
FIG. 15 shows a block diagram of a modification of a cyclic accumulator, in accordance with the present invention, of an estimation and correction block to provide diagnostic signals.

The correction signals accumulated in operation of the systems described above often carry valuable information about the operation of the subconverters and of the overall system. FIG. 15 shows a modification of cyclic accumulator 244 of an estimation and correction block to provide diagnostic signals, in which feedback correction stream 138 is exploited. Feedback correction stream 138 is accumulated to provide cumulative sum 456 in the loop comprising an adder 448 and a register 452. Cumulative sum 456 is delayed N cycles in a shift-register 460 to produce a delayed cumulative sum 464, which is then subtracted from cumulative sum 456 in a subtractor 470 to produce a rolling sum 474. It is known, e.g., in the design of cascaded integrator comb filters, that by proper use of a residue arithmetic system, such as twos-complement arithmetic, it is possible to make rolling sum 474 represent the sum of N consecutive samples of feedback correction term 138 even in the presence of arithmetic overflows in adder circuit 448 and subtractor 470. Rolling sum 474 is divided by N in a divider 478 to provide a rolling average 482. In the common practical case where N is a power of 2, it is well known that this division can be effected simply by shifting or appropriately assigning bits.

Either rolling sum 474 or rolling average 482 may advantageously be used to estimate important parameters of prior art multipath analog to digital converter 10 or analog input signal 14. For example, if cyclic accumulator 244 is part of an offset-correction apparatus such as described above with respect to FIG. 8, then rolling average 482 is an estimate of the sum of the average offset voltage of all subconverters and the DC content of analog input signal 14 (relative to target value 212).

Further, rolling average 482 may be subtracted from individual samples of feedback correction stream 138 in subtractor 486 to produce a multiplexed relative error signal 490. Multiplexed relative error signal 490 may advantageously be used to measure how far individual subconverters vary from the rolling average. For example, if cyclic accumulator 244 is part of an offset-correction apparatus such as described above with respect to FIG. 8, then multiplexed relative error signal 490 represents the extent to which individual offset voltages vary.

In practical multipath analog to digital converters it may be desirable to detect failures of individual subconverters, and excessively large values of multiplexed relative error signal 490 may be considered symptomatic of such failure. In this case multiplexed relative error signal 490 may be compared to some given threshold value 494 in a magnitude comparator 498 which is operable to provide an error signal 502 in the event that the magnitude of multiplexed relative error signal 490 exceeds given threshold value 494.

It will be understood by one skilled in the art that the diagnostic functions illustrated in FIG. 15 are merely examples of some diagnostic functions and that it is straightforward for those of skill in the art to develop systems to compute such related measures as may be desirable.

The embodiments above are operable to remove cyclostationarity in uncorrected data streams due to mismatches in subconverter parameters, and hence suitable for applications in which the input signal is expected to be stationary. In some cases, as described above, cyclostationarity is expected—as for instance when the analog-to-digital converter clock is phase-locked to the input data.

Figure 16:
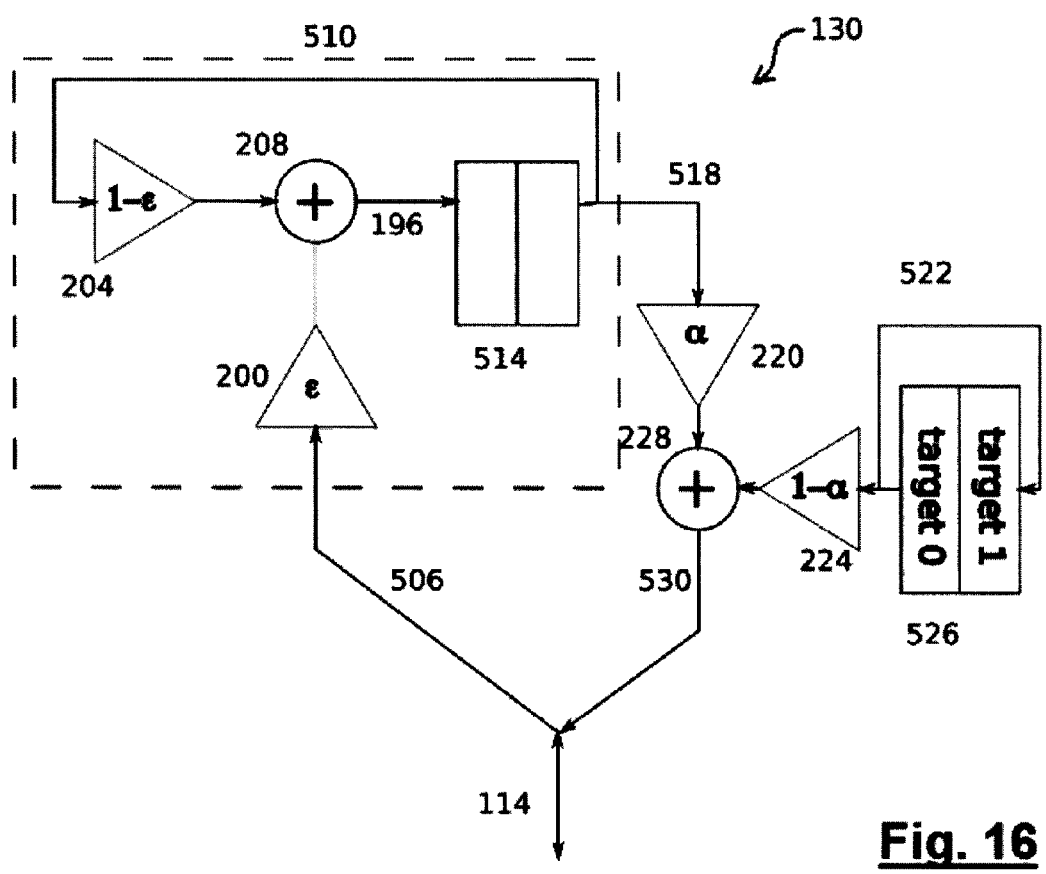
FIG. 16 shows a block diagram of the use of a cyclic ensemble averaging block, in accordance with the present invention, when signal statistics are expected to be cyclostationary.

It is desirable to extend the techniques presented above for use with this cyclostationary-input case. An exemplary embodiment of an ensemble averaging block suitable for this purpose will now be discussed in which statistics vary with period 2—even and odd-numbered samples being expected to come from different (perhaps related) distributions. FIG. 16 shows another embodiment of the present invention which uses a cyclic ensemble averaging block when signal statistics are expected to be cyclostationary, and may be treated as an alternative embodiment of the ensemble estimation block 130, as discussed above with reference to FIG. 5 and like components to those discussed above are indicated with like reference numerals. This embodiment, as well as being adapted to cyclostationary input statistics, operates on a multiplexed measure signal 506 rather than the individual-channel measure streams 146, 166, 170 and 174 of FIG. 5, and hence serves the dual purpose of illustrating multiplexed ensemble measure and treatment of cyclostationary signals.

Distinct phases of multiplexed measure signal 506 are low-pass filtered in a cyclic lowpass filter 510, which in this example is detailed for applications where the period of cyclostationarity is two. Cyclic lowpass filter 510 comprises adder 208, gain blocks 200 and 204, and a two-stage shift register 514, and may be recognized as derived from lowpass filter 186 described above in reference to FIG. 5. The replacement of register 208 with two-stage shift register 514 causes distinct lowpass filters to be updated for even and odd phases. One skilled in the art will recognize that any number of distinct lowpass estimators can be obtained by increasing the length of two-stage shift register 514.

Cyclic lowpass filter 510 produces a cyclic filtered ensemble measure stream 518, which is combined with a cyclic nominal target stream 522 by means of gain blocks 220 and 224 and adder 228 to produce a cyclic target stream 530, suitable for use in estimation and correction blocks as described earlier in this disclosure.

Cyclic nominal target stream 522 is shown in the embodiment of FIG. 16 as being produced by clocking a length-2 shift register 526 with given initial conditions. Several alternate realizations will present themselves to one skilled in the art, as for example the use of multiplexers with nominal targets as input values and clock phases as selectors and such alternate realizations are intended to be within the scope of the present invention.

As an example of an application, if a 4-path analog to digital converter is used in a synchronous clock-and-data recovery circuit for binary phase-shift keyed data wherein it is expected to sample data on even phases and bit transitions on odd edges, a cyclic ensemble-averaging circuit with period 2 as shown in FIG. 16 would be appropriate for managing a gain-control circuit such as that disclosed above with reference to FIG. 9. A simple first approximation is that target 0 (for the data eye opening) should be twice target 1 (for transitions) and that target 0 should be set to exercise most of the conversion range of the subconverters.

Figure 17:
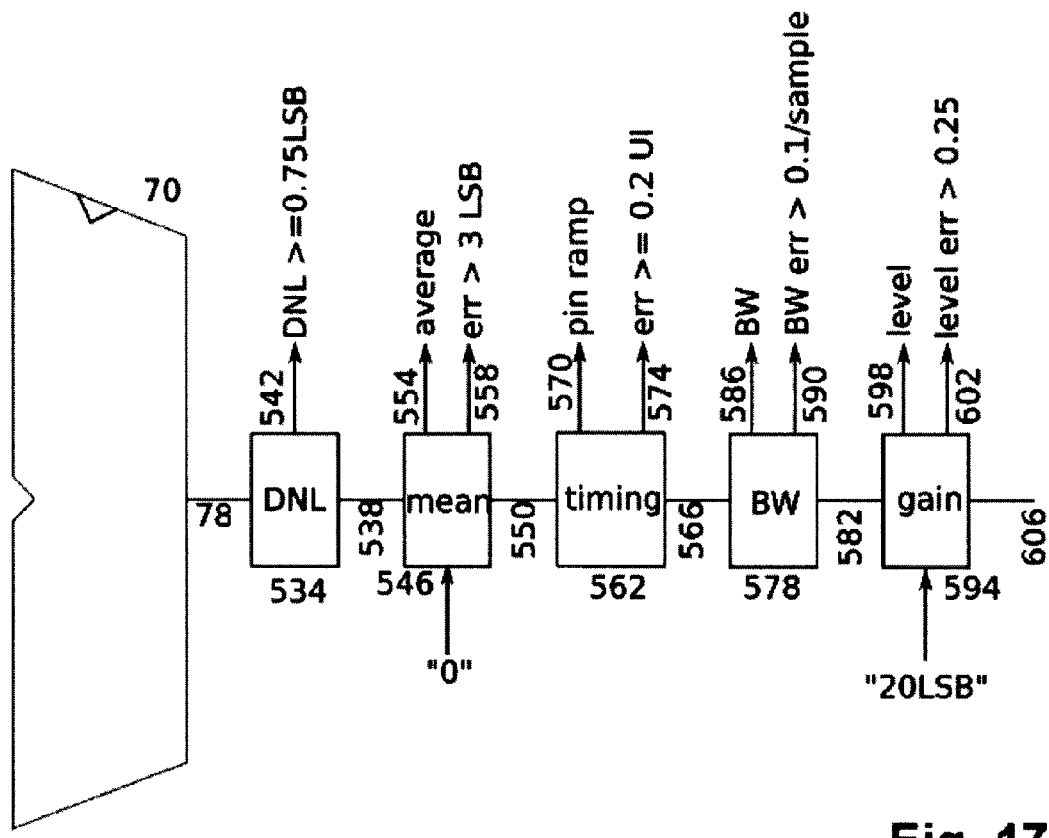
FIG. 17 shows a block diagram wherein different types of correction blocks are cascaded, in accordance with the present invention, in a preferred ordering together with diagnostic outputs valuable in practical systems.

FIG. 17 shows an example of the cascading of different types of correction blocks, in accordance with the present invention, in a preferred ordering together with target inputs and diagnostic outputs valuable in practical systems. The embodiment shown is of measurement and correction blocks operable on multiplexed data streams. Each block takes the corrected multiplexed data stream output of a preceding block, further corrects it, and passes it to the next block for yet more correction. In this embodiment each block corrects a different mismatch error.

Uncorrected multiplexed data stream 78 first passes into a DNL correction block 534, such as that disclosed above with reference to FIG. 11, operable to correct DNL at the MSB. DNL correction block 534 produces partially corrected multiplexed data stream 538 (corresponding to corrected multiplexed data stream 240 discussed above with reference to FIG. 11). DNL correction block 534 also produces a DNL diagnostic output 542, according to the methods discussed above with reference to FIG. 15, which is operable to raise an error alert when a DNL error larger than 0.75 least-significant bits in magnitude must be corrected. This error alert can be used, for example, to call for replacement of a failing analog-to-digital converter.

It is convenient to place a DNL correction block early in a cascade, because the correction operations in other blocks may obscure the points at which the bits of a given subconverter are changed and therefore hamper the operation of said DNL correction block.

Partially corrected multiplexed data stream 538 is then passed into an offset-correction block 546, such as that discussed above with reference to FIG. 8, which is operable to correct DC offsets in subconverters. Partially corrected multiplexed data stream 538 takes the role of uncorrected multiplexed data stream 78, discussed above with reference to FIG. 8 and a DC-corrected multiplexed output data stream 550 is produced, corresponding to corrected multiplexed data stream 240 discussed above with reference to FIG. 8.

In this example, a target of zero is chosen for the mean, in the manner discussed above, so that all phases of further DC-corrected multiplexed output data stream 550 will have DC value of zero. It is desirable to have zero mean when computing measures involving correlations, such as those for timing, bandwidth and gain correction, because non-zero means are known to bias these estimates. It is therefore preferred to place the offset-correction block 546 ahead of blocks for correcting timing, bandwidth and gain in a cascade.

Offset-correction block 546 is also operable to produce two diagnostic outputs, again according to the methods discussed above with respect to FIG. 15: an average-bandwidth estimate 554; and a second error flag 558. Average-bandwidth estimate 554 serves to carry DC-corrected multiplexed output data stream 550 that would otherwise be discarded by forcing its mean to zero. Second error flag 558 is operable to indicate that at least one of the subconverters has an excessively large offset, in this example defined as an offset that differs from the average offset by more than three least-significant bits. DC-corrected multiplexed output data stream 550 is then passed into a timing-correction block 562, such as that discussed above with reference to FIG. 12, which is operable to correct timing errors in multiphase clocking circuit 34 of FIG. 1, or equivalent effects in wiring or in subconverter circuits. DC-corrected multiplexed output data stream 550 takes the role of uncorrected multiplexed data stream 78 discussed above with reference to FIG. 12 and a timing-corrected multiplexed data stream 566 is produced, corresponding to corrected multiplexed data stream 240 discussed above with reference to FIG. 12. Timing-correction block 562 is also operable to produce two diagnostic outputs, again according to the methods discussed above with reference to FIG. 15: a pin ramp diagnostic 570; and an excess-timing-error flag 574.

Pin ramp diagnostic 570 is derived as the phase of feedback correction stream 138 discarded by pinning multiplexer 360 discussed above with reference to FIG. 12. Because this signal is never used for feedback, it can grow without bound in what is known as a drunkard's walk and, in fact, the rate at which it grows is indicative of the average power level of timing offset error. It may, for example, be desired to monitor this growth rate in order to set gain parameter $\epsilon$ appropriately.

Excess-timing-error flag 574 in this example is set to alert the presence of any timing correction larger than 20% of a unit interval, and might be used to schedule component replacement.

Timing-corrected multiplexed data stream 566 is then passed to a bandwidth-correction block 578, such as that discussed above with reference to FIG. 13, which is operable to correct mismatches in the bandwidths of sample/hold circuits. In this example bandwidth correction block 578 is configured to force zero correlation between consecutive samples, i.e.—to perform first-order whitening. Timing-corrected multiplexed data stream 566 takes the role of uncorrected multiplexed data stream 78 as discussed above with reference to FIG. 13 and a bandwidth-corrected multiplexed data stream 582 is produced, corresponding to corrected multiplexed data stream 240 discussed above with reference to FIG. 13.

Bandwidth-correction block 578 is also operable to produce two diagnostic outputs, again according to the methods discussed above with reference to FIG. 15: a average-bandwidth estimate 586; and a fourth error flag 590. Average-bandwidth estimate 586 serves to carry bandwidth information about timing-corrected multiplexed data stream 566 that would otherwise be discarded by forcing first-order whitening. Fourth error flag 590 is operable to indicate that at least one of the subconverters has an excessively large bandwidth difference from the others, in this example defined as a correlation correction term that differs from the average by more than 0.1.

Bandwidth-corrected multiplexed data stream 582 is then passed to a gain-correction block 594, such as that discussed above with reference to FIG. 9, which is operable to correct mismatches in the gains of subconverters. In this example, gain correction block 594 is configured to force an average magnitude of twenty least-significant bits. Bandwidth-corrected multiplexed data stream 582 takes the role of uncorrected multiplexed data stream 78 as discussed above with reference to FIG. 9 and a gain-corrected multiplexed output data stream 606 is produced, corresponding to corrected multiplexed data stream 240 discussed above with reference to FIG. 9.

Gain-correction block 594 is also operable to produce two diagnostic outputs, again according to the methods discussed above with reference to FIG. 15: an average-level estimate 598; and a fifth error flag 602. Average-level estimate 598 serves to estimate how much gain has to be applied to bring the signal to the desired level, and values outside some predetermined range would typically indicate that the input signal to the overall analog-to-digital converter was not correctly adjusted. Fifth error flag 602 is operable to indicate that at least one of the subconverters has an excessive relative gain error, in this example defined as a level correction term that differs from the average by more than 25%. It is desirable to place gain-correction block 594 after timing-correction block 562 and bandwidth-correction block 578, because these prior blocks may be expected to induce gain errors, which gain-correction block 594 can clean up.

The net effect of the cascade of correction blocks disclosed in FIG. 17 is that five important types of mismatch error in multipath converters are simultaneously corrected to produce gain-corrected multiplexed output data stream 606.

Appendix A includes source code to model the measure and correction blocks of the embodiment of FIG. 12 to compensate for errors in uniformity of sample timing. This source code is for version 7.0.1 of the Ptolemy simulation system, created by the Department of Electrical Engineering and Computer Sciences at the University of California Berkeley and which is available for free use under a Copyright License from the Regents of the University of California.

Figure 18A:
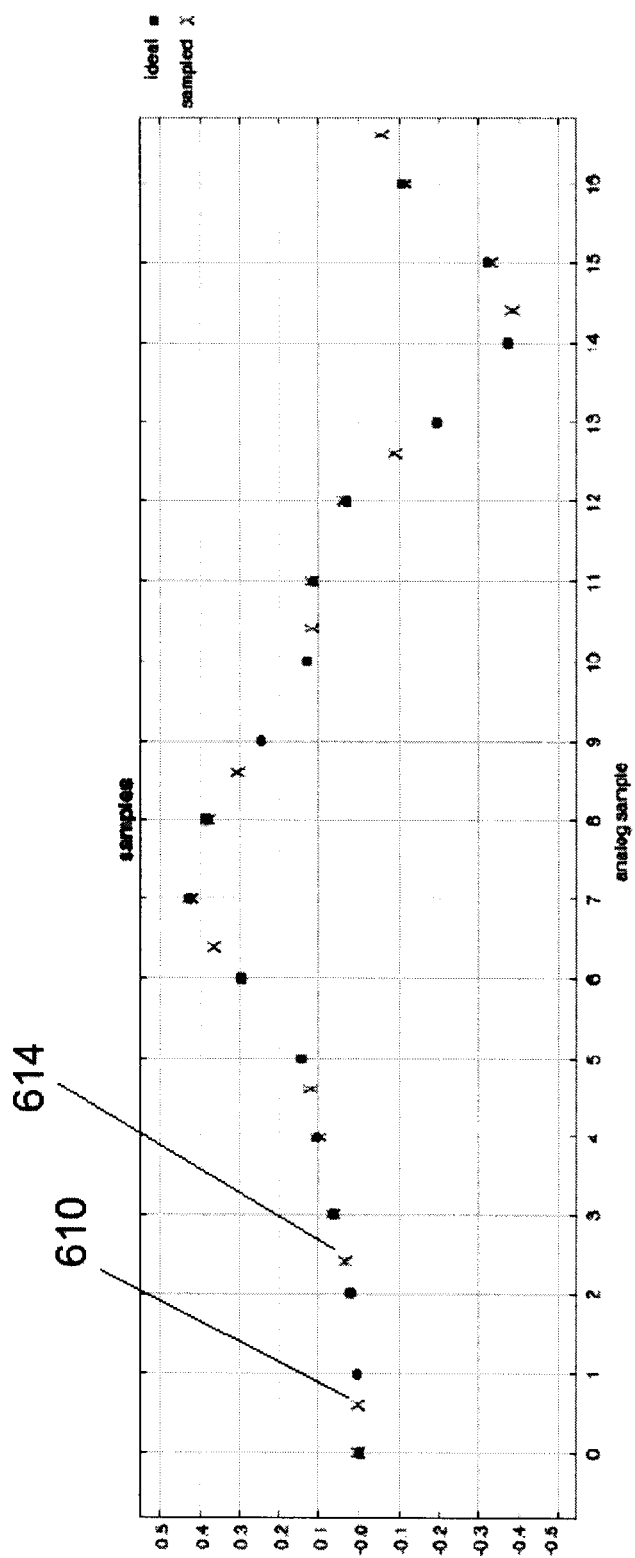
FIGS. 18a and 18b show a set of actual samples and that set of samples if sampled with correct timing.
Figure 18B:
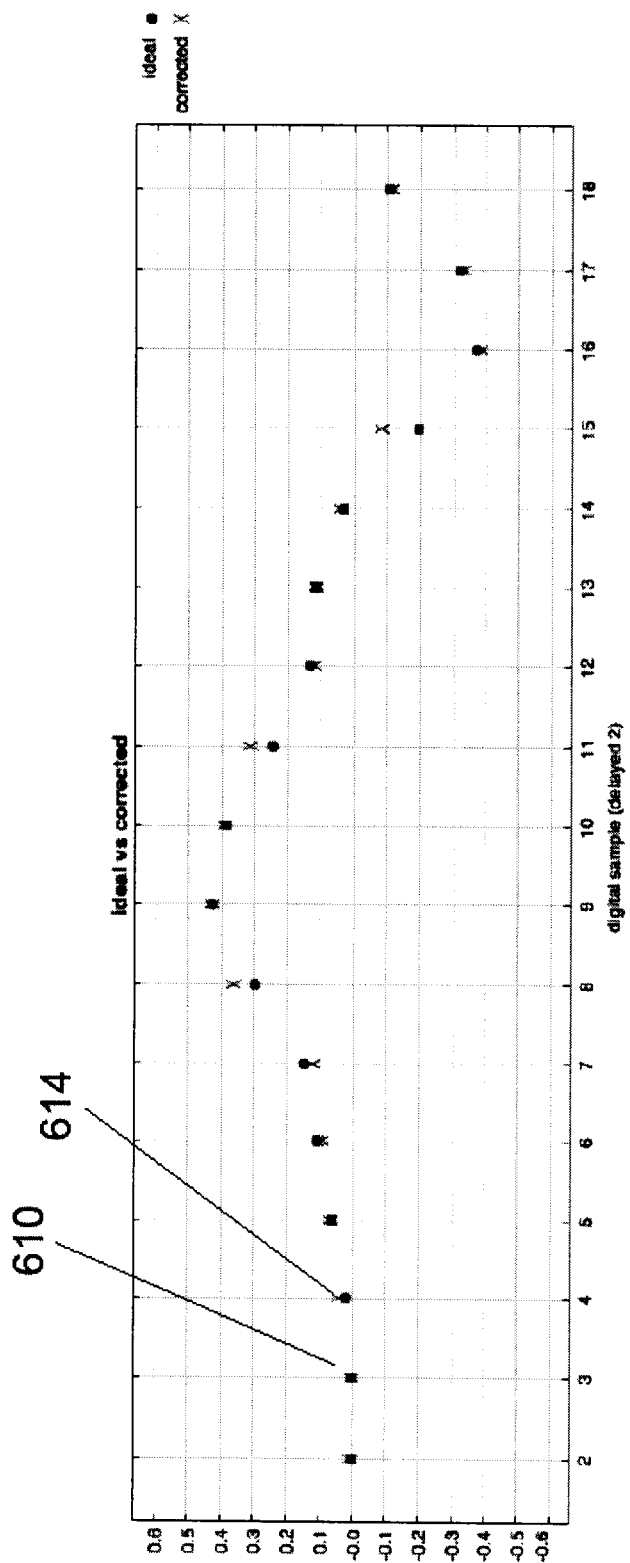

FIGS. 18a and 18b illustrate the effect of timing error in a simulation of a multipath converter. The samples marked as circles in FIG. 18a represent the signal values that an ideal set of subconverters would have taken and the crosses represent samples as taken by a non-ideal system in which the clocking signals for the subconverters are not evenly spaced. Note, for example, that the sample labeled 610 that should have been taken at time t=1 was actually taken early, at time t=0.6, while the sample labeled 614 that should have been taken at time t=2 was taken late, at time t=2.4. The error is cyclic with period 4: samples 0, 4, 8, 12 and so on are at the correct time, samples 1, 5, 9 and 13 are all early, and so on.

The non-ideal samples shown in FIG. 18a are correct samples of the signal as shown, but to interpret them correctly it is necessary to know at what times the samples were taken. That information is not available, because it results from unknown mismatches in the clock and subconverter circuitry.

Practical digital signal processing systems usually assume that samples are taken uniformly, with the result shown in FIG. 18b. The non-ideal samples marked by crosses are interpreted mathematically as if they had been taken at uniform spacing. Note by comparison with FIG. 18a that the early sample 610 that was actually taken at time t=0.6 is interpreted as having been taken at time t=1, while the late sample 614 is interpreted as having been taken at time t=2 instead of time t=2.4. The result is that the signal is an effective error in sampling the signal, as can be seen by the differences between the ideal (circle) and non-ideal (cross) cases.

It should be noted that the time axis is shifted by 2 between FIGS. 18a and 18b and this represents the effects of registers 344 and 396 of FIG. 12, with the ideal samples having been mathematically shifted by a like amount for convenience of comparison.

Figure 19:
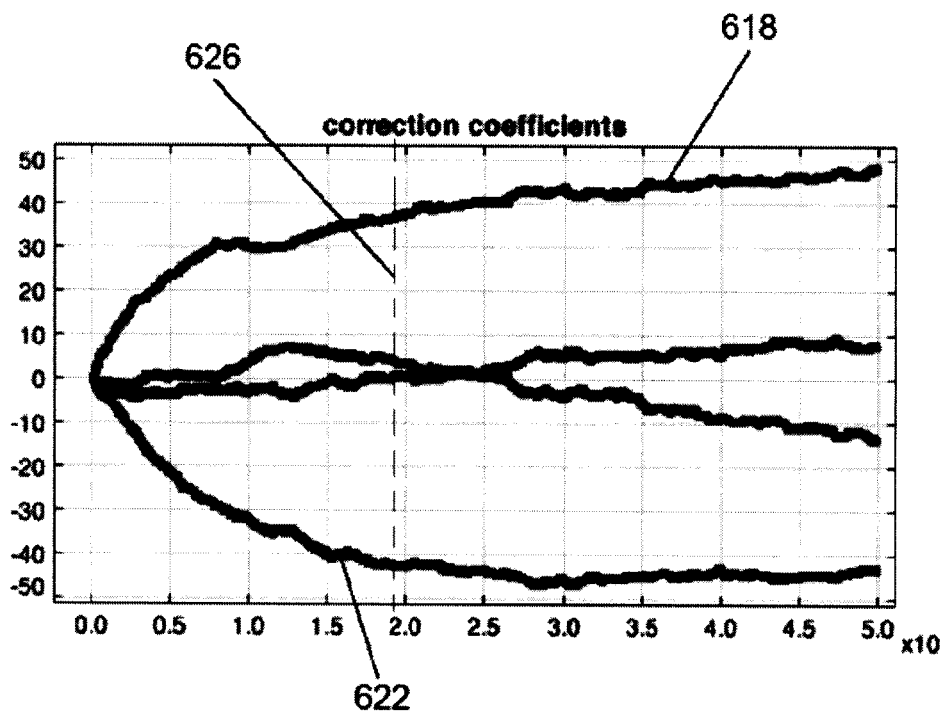

Use of the system of FIG. 12 results in the correction stream 138 shown in FIG. 19. The sequence appears to form four curves: one curve comprises samples 0, 4, 8 etc. of correction stream 138; another curve comprises samples 1, 5, 9 etc., and so on. Each of the four curves represents the evolution of a timing correction coefficient applicable to a corresponding one of the four phases of subconverter clock in the simulation. It will be observed that curve 618 goes high, following the form of a decaying exponential, while curve 622 goes low in a similar form. These correspond to timing corrections for the early and late phases. The curves have approximately converged to their asymptotic values after 19,000 samples, as labeled at 626.

Figure 20:
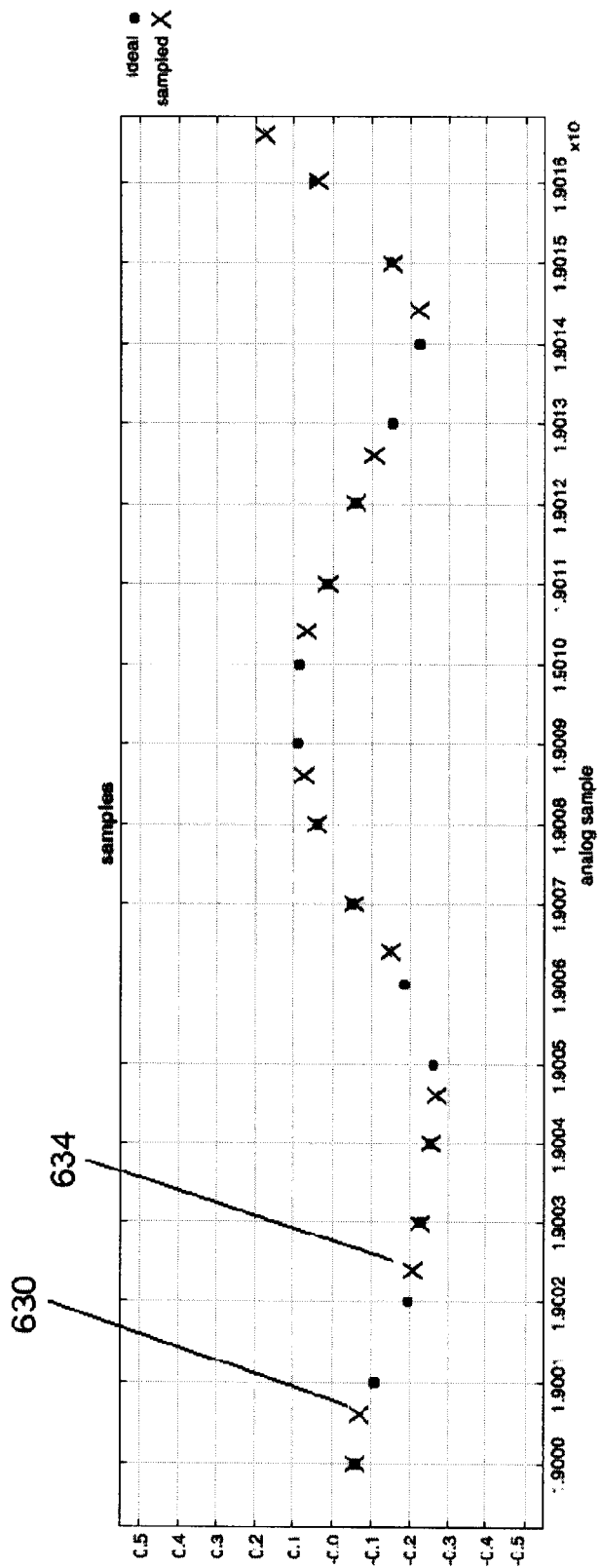
FIG. 20 shows a second set of samples corresponding to FIG. 18a after effective convergence.

FIG. 20 shows the same signals as in FIG. 18a, but after approximate convergence of the system of FIG. 12 at 19,000 samples. The ideal (circle) and actual (cross) samples are marked in FIG. 20 as they were in FIG. 18a. "Early" and "late" samples labeled 630 and 634 would, if simply interpreted as having been taken at the expected times, represent substantial error.

Figure 22:
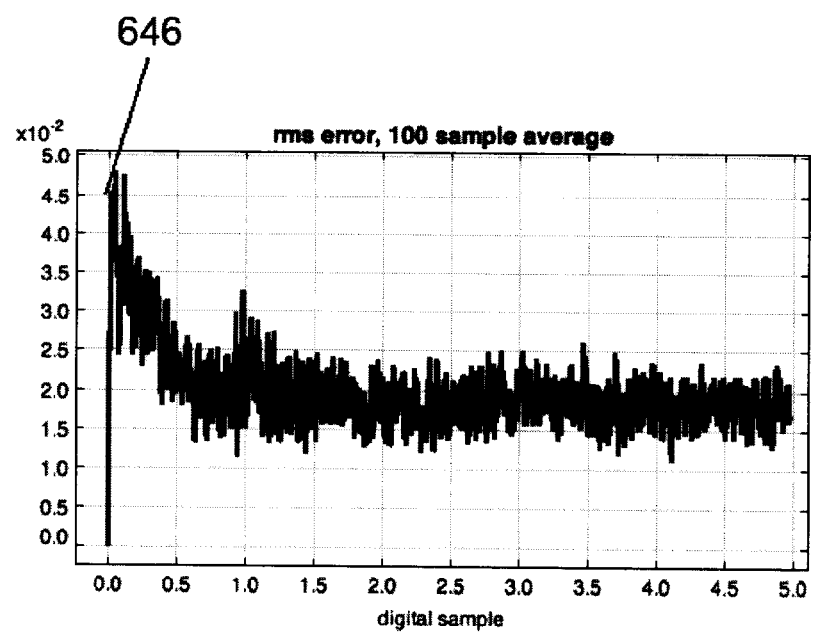
FIG. 22 shows the decrease in the root mean square error of the sampled signal of FIG. 21 as the corrections converge.
Figure 21:
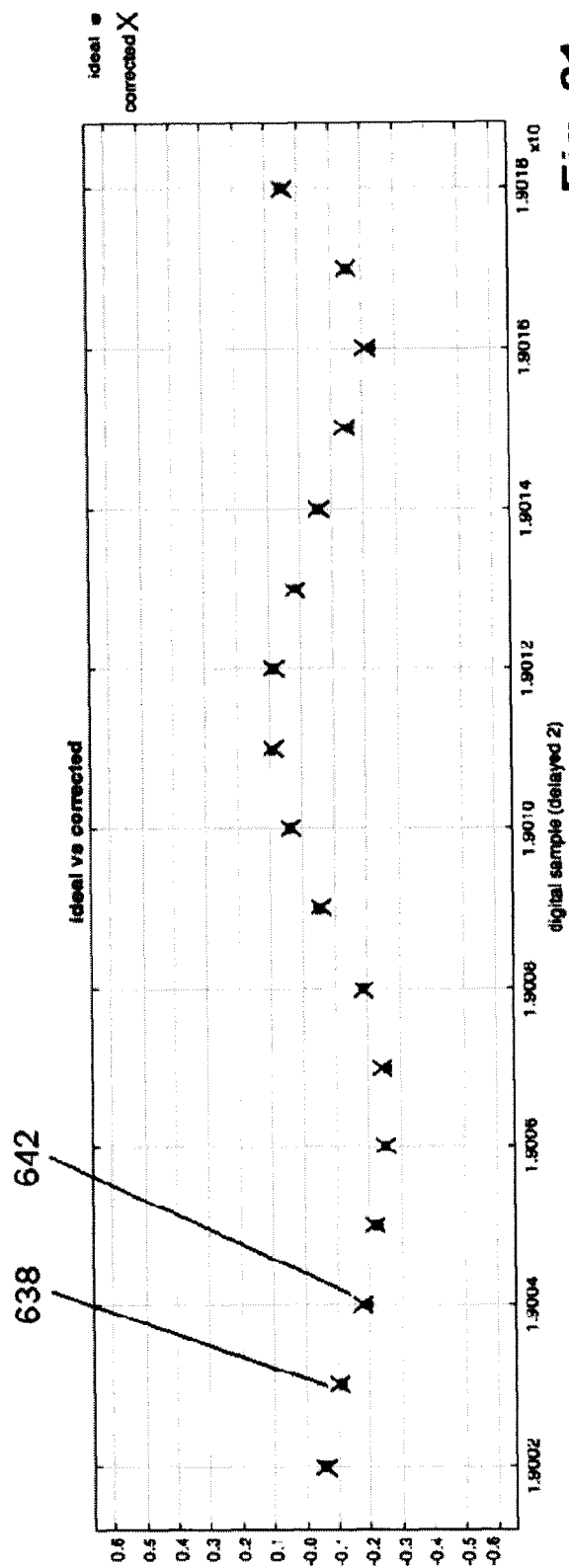
FIG. 21 shows the set of samples of FIG. 20 after correction.

The effect of the correction block 134 of FIG. 12 is to calculate new values to replace samples 630 and 634 and these are shown in FIG. 21 where they are labeled 638 and 642, respectively. They are substantially closer to the ideal values than were 630 and 634. FIG. 22 quantifies the improvement obtained. It plots the root-mean-square (rms) difference between ideal and corrected signals 240 over time, with the mean taken as a rolling average of 100 samples. Initially, at the point labeled 646, the rms error is approximately 0.045; but after convergence it is generally less than 0.02. This represents a factor of two improvement, corresponding to an improvement of 6 dB in the signal-to-noise ratio of the system, or equivalently improving the effective accuracy of the converter system by one bit.

The present invention provides a system and method of reducing the effects of nonidealities of ADCs in multipath converters. The system and method employs a variety of measure and correction blocks to determine statistical properties of the output stream of the multipath converter and to apply corrections to the operation of the subconverters of the multipath converter based upon differences in the measured statistics and expected target values, either explicit or implicit, for those statistics. A variety of examples of possible measure and configuration blocks are disclosed, as is the cascading of the measure and correction blocks to correct multiple errors in the output of the multipath converter. Feedforward (purely digital) and feedback (analog and digital) solutions are both disclosed.

The above-described embodiments of the invention are intended to be examples of the present invention and alterations and modifications may be effected thereto, by those of skill in the art, without departing from the scope of the invention which is defined solely by the claims appended hereto.

I claim:

1. A multipath analog to digital converter comprising:
at least two subconverters each operable to sample respective samples of an analog signal applied to the multipath analog to digital converter and to output a digital value representing the sample of the analog signal; and
at least one measure and correction block operable to determine mismatches in bandwidths of the at least two subconverters and to output a correction signal representing the mismatches in bandwidths of the at least two subconverters, the correction signal comprising an analog signal applied to the input of the multipath analog to digital converter, the correction signal altering the operation of the multipath analog to digital converter to reduce error in the output of the multipath analog to digital converter.

2. A multipath analog to digital converter according to claim 1 wherein the at least one measure and correction block is further operable to determine differential nonlinearity (DNL) of the at least two subconverters and to output an additional correction signal to compensate for the DNL, the additional correction signal further altering the operation of the multipath analog to digital converter.

3. A multipath analog to digital converter comprising:
at least two subconverters each operable to sample respective samples of an analog signal applied to the multipath analog to digital converter and to output a digital value representing the sample of the analog signal; and
at least one measure and correction block operable to determine mismatches in bandwidths of the at least two subconverters and to output a correction signal representing the mismatches in bandwidths of the at least two subconverters, the correction signal comprising an analog signal applied to the input of the multipath analog to digital converter and a digital signal applied to the output of the multipath analog to digital converter, the correction signal altering the operation of the multipath analog to digital converter to reduce error in the output of the multipath analog to digital converter.

4. A multipath analog to digital converter according to claim 3 wherein the at least one measure and correction block is further operable to determine differential nonlinearity (DNL) of the at least two subconverters and to output an additional correction signal to compensate for the DNL, the additional correction signal further altering the operation of the multipath analog to digital converter.

5. A multipath analog to digital converter comprising:
   at least two subconverters each operable to sample respective samples of an analog signal applied to the multipath analog to digital converter and to output a digital value representing the sample of the analog signal; and
   at least one measure and correction block operable to determine mismatches in bandwidths of the at least two subconverters and to output a correction signal representing the mismatches in bandwidths of the at least two subconverters, the correction signal controlling a weighting of addition of samples representing undelayed and delayed samples of the multipath analog to digital converter, the correction signal altering the operation of the multipath analog to digital converter to reduce error in the output of the multipath analog to digital converter.

6. A multipath analog to digital converter according to claim 5 wherein the at least one measure and correction block comprises an adaptive finite impulse response filter.

7. A multipath analog to digital converter according to claim 5 wherein the at least one measure and correction block is further operable to determine differential nonlinearity (DNL) of the at least two subconverters and to output an additional correction signal to compensate for the DNL, the additional correction signal further altering the operation of the multipath analog to digital converter.

8. A multipath analog to digital converter comprising:
   at least two subconverters each operable to sample respective samples of an analog signal applied to the multipath analog to digital converter and to output a digital value representing the sample of the analog signal; and
   at least one measure and correction block operable to determine mismatches in bandwidths of the at least two subconverters and to output a correction signal representing the mismatches in bandwidths of the at least two subconverters, the correction signal altering the operation of the multipath analog to digital converter to reduce error in the output of the multipath analog to digital converter, the at least one measure and correction block further operable to apply the correction signal to the output of the multipath analog to digital converter before a gain correction signal is applied.

9. A multipath analog to digital converter according to claim 8 wherein the at least one measure and correction block is further operable to determine differential nonlinearity (DNL) of the at least two subconverters and to output an additional correction signal to compensate for the DNL, the additional correction signal further altering the operation of the multipath analog to digital converter.

10. A multipath analog to digital converter comprising:
    at least two subconverters each operable to sample respective samples of an analog signal applied to the multipath analog to digital converter and to output a digital value representing the sample of the analog signal; and
    at least one measure and correction block operable to determine mismatches in bandwidths of the at least two subconverters and to output a correction signal representing the mismatches in bandwidths of the at least two subconverters, the correction signal altering the operation of the multipath analog to digital converter to reduce error in the output of the multipath analog to digital converter, the at least one measure and correction block further operable to apply the correction signal to the output of the multipath analog to digital converter after a timing correction signal is applied.

11. A multipath analog to digital converter according to claim 10 wherein the at least one measure and correction block is further operable to determine differential nonlinearity (DNL) of the at least two subconverters and to output an additional correction signal to compensate for the DNL, the additional correction signal further altering the operation of the multipath analog to digital converter.

12. A multipath analog to digital converter comprising:
    at least two subconverters each operable to sample respective samples of an analog signal applied to the multipath analog to digital converter and to output a digital value representing the sample of the analog signal; and
    at least one measure and correction block operable to determine mismatches in bandwidths of the at least two subconverters and to output a correction signal representing the mismatches in bandwidths of the at least two subconverters, the correction signal altering the operation of the multipath analog to digital converter to reduce error in the output of the multipath analog to digital converter, the at least one measure and correction block further operable to apply the correction signal to the output of the multipath analog to digital converter after an offset correction signal is applied.

13. A multipath analog to digital converter according to claim 12 wherein the at least one measure and correction block is further operable to determine differential nonlinearity (DNL) of the at least two subconverters and to output an additional correction signal to compensate for the DNL, the additional correction signal further altering the operation of the multipath analog to digital converter.

14. A multipath analog to digital converter comprising:
    at least two subconverters each operable to sample respective samples of an analog signal applied to the multipath analog to digital converter and to output a digital value representing the sample of the analog signal; and
    at least one measure and correction block operable to determine mismatches in bandwidths of the at least two subconverters and to output a correction signal representing the mismatches in bandwidths of the at least two subconverters, the correction signal altering the operation of the multipath analog to digital converter to reduce error in the output of the multipath analog to digital converter, the at least one measure and correction block further operable to apply the correction signal to the output of the multipath analog to digital converter after a differential nonlinearity (DNL) correction signal is applied.

15. A multipath analog to digital converter comprising:
    at least two subconverters each operable to sample respective samples of an analog signal applied to the multipath analog to digital converter and to output a digital value representing the sample of the analog signal; and
    at least one measure and correction block operable to determine differential nonlinearity (DNL) of the at least two subconverters and to output a correction signal to compensate for the DNL, the correction signal comprising an analog signal applied to the input of the multipath analog to digital converter and a digital signal applied to the output of the multipath analog to digital converter, the correction signal altering the operation of the multipath analog to digital converter to reduce error in the output of the multipath analog to digital converter.

16. A multipath analog to digital converter comprising:
at least two subconverters each operable to sample respective samples of an analog signal applied to the multipath analog to digital converter and to output a digital value representing the sample of the analog signal; and
at least one measure and correction block operable to determine differential nonlinearity (DNL) of the at least two subconverters and to output a correction signal to compensate for the DNL, the correction signal altering the operation of the multipath analog to digital converter to reduce error in the output of the multipath analog to digital converter, the at least one measure and correction block operable to determine the correction signal based on a preselected bit transition in samples of the multipath analog to digital converter and to selectively add the correction signal to samples of the multipath analog to digital converter based on a value of the preselected bit.

17. A multipath analog to digital converter according to claim 16 wherein the preselected bit comprises the most-significant bit.

* * * * *